United States Patent [19]
Mochizuki et al.

[11] Patent Number: 5,506,813
[45] Date of Patent: Apr. 9, 1996

[54] SEMICONDUCTOR APPARATUS AND METHOD OF MANUFACTURING THE SAME

[75] Inventors: Yoshio Mochizuki; Hideo Kato, both of Kawasaki; Nobutake Sugiura, Yokohama, all of Japan

[73] Assignee: Kabushiki Kaisha Toshiba, Kawasaki, Japan

[21] Appl. No.: 235,371

[22] Filed: Apr. 29, 1994

[30] Foreign Application Priority Data

May 1, 1993 [JP] Japan .................................. 5-128183

[51] Int. Cl.$^6$ .............................. G11C 7/00; H01L 27/10
[52] U.S. Cl. ................... 365/230.03; 365/104; 365/205; 365/231; 365/242
[58] Field of Search ................................ 365/104, 63, 94, 365/230.03, 230.06, 205, 231, 242

[56] References Cited

U.S. PATENT DOCUMENTS

| | | | |
|---|---|---|---|
| 5,053,648 | 10/1991 | Van den Elshout et al. | 365/104 |
| 5,241,497 | 8/1993 | Komarek | 365/230.03 |
| 5,262,984 | 11/1993 | Noguchi et al. | 365/185 |
| 5,268,861 | 12/1993 | Hotta | 365/104 |
| 5,295,092 | 3/1993 | Hotta | 365/104 |
| 5,341,337 | 8/1994 | Hotta | 365/104 |

FOREIGN PATENT DOCUMENTS

| | | |
|---|---|---|
| 0109854 | 5/1984 | European Pat. Off. . |
| 0424964 | 5/1991 | European Pat. Off. . |
| 3842511 | 6/1989 | Germany . |

OTHER PUBLICATIONS

European Search Report dated Sep. 1, 1994, Appl. No. 94106761.3.
David A. Rich, et al. "A Four–State ROM Using Multilevel Process Technology", IEEE Journal of Solid–State Circuits, SC–19 (1984) Apr., No. 2, New York, USA.

Primary Examiner—Viet Q. Nguyen
Attorney, Agent, or Firm—Loeb & Loeb

[57] ABSTRACT

In a semiconductor memory apparatus having a cell array structure wherein occurrence of leak current is reduced and a margin at the time of sensing is increased, a plurality of memory transistors arranged in a matrix and having any one of four thresholds constitute banks in a column direction. The banks constitute memory cell arrays. A main bit line of Al is connected to three sub-bit lines via first selection transistors. A main ground line of Al is connected to two sub-ground lines via second selection transistors. Bank selection lines and word lines are formed to cross the main bit line and main ground line. Gates of the selection transistors are connected to the selection lines, and one selection line is connected to one selection transistor. Each of the sub-bit lines and sub-ground lines has a column of memory transistors which constitute a bank. A separation region (not shown) of a silicon oxide film, etc. is formed between the memory cell arrays to prevent leak current. Thereby, an information amount per one element can be made equal to a plural-bit information amount, and the bit data capacity can be increased.

10 Claims, 18 Drawing Sheets

| | SL1 | SL2 | SL3 | SL4 | SL5 |
|---|---|---|---|---|---|
| CELL 1 | ○ | | | | ○ |
| CELL 2 | | ○ | | | ○ |
| CELL 3 | | ○ | | ○ | |
| CELL 4 | | | | ○ | ○ |

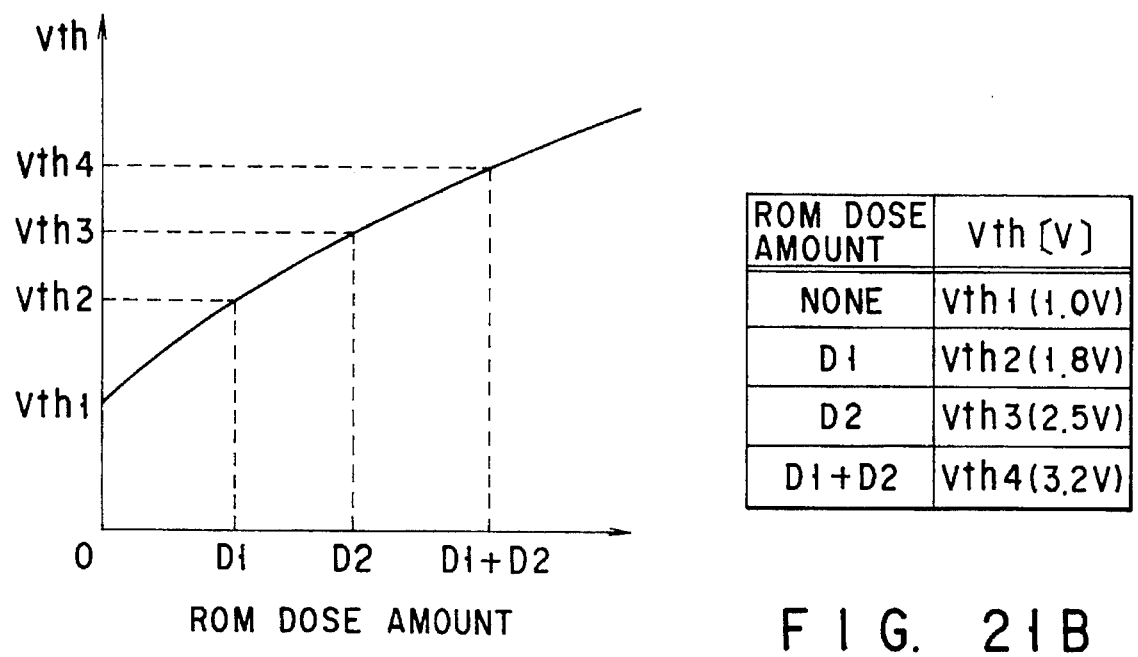
FIG. 21A
FIG. 21B
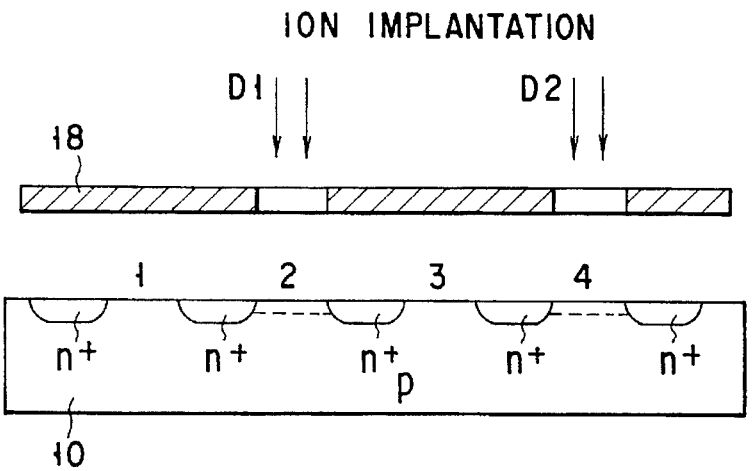
FIG. 22A
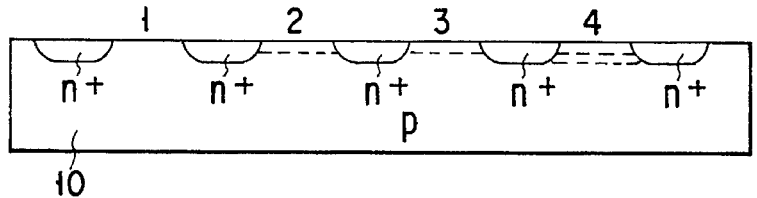
FIG. 22B

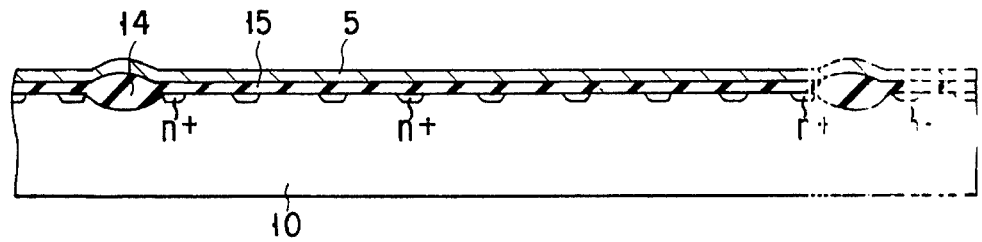
F I G. 23
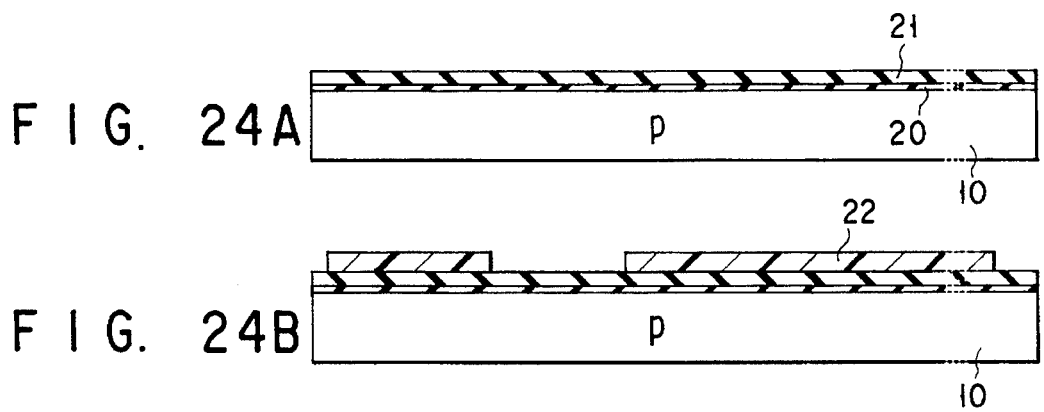
F I G. 24A
F I G. 24B
F I G. 24C
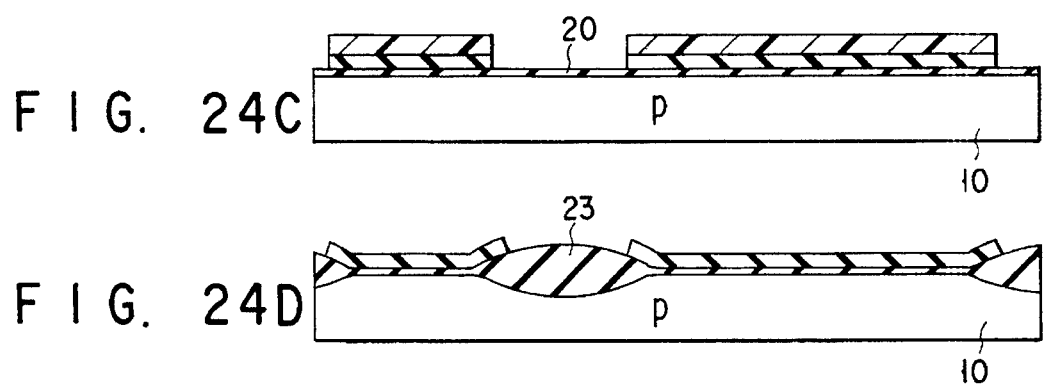
F I G. 24D
F I G. 24E
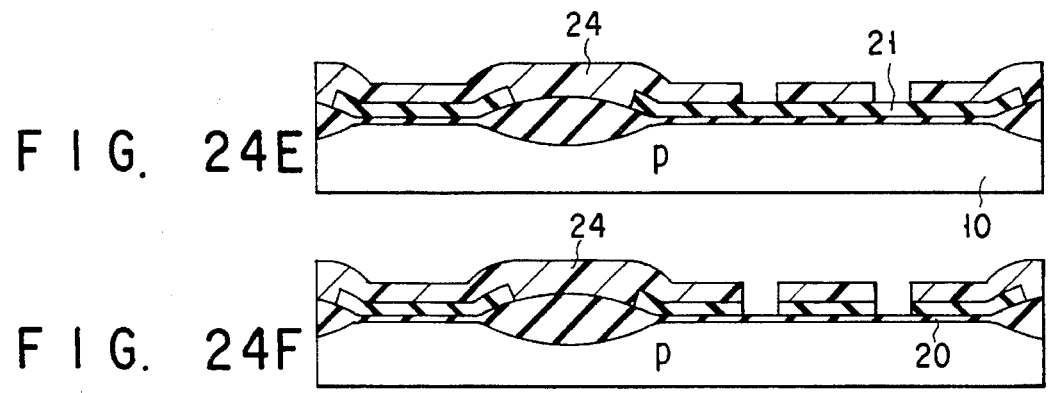
F I G. 24F 5,506,813

SEMICONDUCTOR APPARATUS AND METHOD OF MANUFACTURING THE SAME

BACKGROUND OF THE INVENTION

1. Field of the Invention

The present invention relates to a semiconductor memory apparatus and a method of manufacturing the same, and more particularly to a memory cell array structure of ROMs (Read Only Memory) for storing multi-value level data.

2. Description of the Related Art

In a conventional ROM memory cell array which is a general read-only semiconductor memory apparatus, memory cells comprising MOS FETs are arranged in a matrix. The gates of the memory cells are connected to a plurality of word lines extending in the row direction, and the sources and drains are connected to a plurality of bit lines extending in the column direction. In this structure, the capacity of the array is increased and the number of memory cells connected to the bit lines increases. Accordingly, a parasitic capacitance of the bit lines increases and read-out speed decreases. There has been proposed a bank-type ROM in which the parasitic capacity of the bit lines is decreased and the read-out speed is improved. In this ROM, the bit lines comprise main bit lines with a longer wiring length and sub-bit lines with a less wiring length. The memory cells are stored in a plurality of banks, and the sub-bit lines are connected to memory cells of the banks. The main bit lines are connected to sub-bit lines via selection transistors. In this ROM memory array having this structure, a predetermined memory cell is read out in the following manner. The selection transistor is operated on the basis of a bank selection signal representing the bank to be selected, to which the predetermined memory cell belongs. Thereby, the sub-bit line is electrically connected to the main bit line.

The word line connected to the gate of the predetermined memory cell is set at high level and the data in the predetermined memory cell is read out. Since the operation is effected in the state in which the sub-bit line of the bank is electrically connected to the main bit line and the junction capacitance of the memory cells of each column is divided, an operation delay can be prevented effectively. In a ROM, a one-bit memory is normally composed of one transistor. In order to set data in each memory cell, a threshold voltage of the memory cell set in two levels, a high level and a low level. Even if the data is set in this manner, only one-bit data can be stored in one memory cell. Thus, in order to fabricate a large-capacity memory, the chip size increases disadvantageously.

In order to solve this problem, a method has been proposed wherein two-bit data is stored in one memory cell and thereby the chip size is reduced. A ROM employing this method is called "multi-value ROM." According to this method, a gate length or a gate width of a transistor of a memory cell is varied to set a plurality of different current values, or an implantation amount is varied to set a threshold voltage at a plurality of levels. In this description, the method in which the threshold voltage is varied will be explained.

FIG. 1 shows a conventional bank-type ROM and more particularly it is a plan view of a memory cell array formed on a semiconductor substrate 10 by using an imaginary ground method. Main bit lines 1 and main imaginary ground lines 2 arranged alternately on the semiconductor substrate 10 are made of aluminum, and sub-bit lines 3 and sub-ground lines 4 are formed of an N$^+$ diffusion layer on a surface region of the semiconductor substrate. Thus, these lines have a bit line multi-layer structure. Word lines 5 and bank selection lines 6 crossing the main bit lines and main imaginary ground lines are formed of a polycide layer. Memory transistors 7 are formed such that their sources and drains are formed of intersection portions between the N$^+$ diffusion layer and polycide layer. A memory cell array, which comprises bank selection transistors 8 connected to the sub-bit lines at one end and the memory transistors 7 having gates connected to 32 gate lines, is divided in units of a bank along the bit lines. The divided sub-bit line is connected to the main bit line via the bank selection transistor. The main imaginary ground line is connected via the bank selection transistor to the sub-ground line to which the source of the memory cell transistor is connected. The main bit line and main imaginary ground line are arranged adjacent to each other. In this prior-art example, four banks constitute one memory cell array. In this way, the device section of the ROM consists of a plurality of memory cells, and a plurality of memory cells are arranged in a matrix.

FIG. 2 is a cross-sectional view of the memory transistor 7 formed in a device region of a surface portion of the silicon semiconductor substrate used in the ROM. A source region 11 and a drain region 12 are formed in the surface portion of the semiconductor substrate 10 such that the source region 11 and drain region 12 are situated apart from each other. A gate 9 is formed above a portion of the semiconductor substrate 10 between both regions, with a gate oxide film (not shown) interposed. The gate 9 is made of a polycide having such a structure that a silicide such as tungsten silicide is formed on a polysilicon. The gate 9 is continuous with the gates of other adjacent memory transistors, thereby forming the word line 5 shown in FIG. 1. If necessary, ions are implanted in the portion between the source and drain regions 11 and 12 below the gate 9, thereby controlling the threshold value of the transistor. In this example, four different thresholds are set. After the polysilicon gate 9 is formed, the threshold control ion implantation ("ROM implantation"), i.e. channel implantation, is performed through the polysilicon gate 9, thereby varying the threshold voltage of the memory cell. In this case, if the channel implantation is not performed, another threshold value is set. Thus, if the channel implantation is not performed, four threshold voltages are obtained by selecting the implantation amount among implantation amount 1, implantation amount 2 and implantation 3 (implantation amount 1>implantation amount 2>implantation amount 3).

FIG. 3 is a current/voltage (Id—Vg) characteristic graph showing a relationship between the threshold voltage of the memory cell and the drain current. The right portion of FIG. 3 shows stored data items corresponding to the threshold values. The threshold voltage Vth is set, e.g. at one of four threshold voltage values, Vth1 to Vth4, as shown in FIG. 3, in accordance with two-bit data D0, D1 stored in the memory cell. Specifically, if the ROM implantation corresponding to the threshold voltage Vth2 is performed, data "0" is output in accordance with address D0 and data "1" is output in accordance with address D1. Reference levels (Ref1, Ref2, Ref3) are set at intermediate levels of potentials set by the threshold voltages Vth1, Vth2, Vth3 and Vth4 when the gate voltage (Vg) of the memory cell is 5 V. In order to detect the multi-value data of the memory cell, a reference voltage output from a reference voltage generating circuit is input to a sense amplifier, and the threshold voltage vth input to the amplifier is compared with the reference voltage. A comparison result is input to a logical circuit. Data items corresponding to the two addresses D0 and D1 are read out from the logical circuit. Thereby, two-bit data can be read out from the one-bit memory cell, and double-amount data can be stored in the memory cell having the same size as a conventional one. In other words, with the same memory capacity as prior art, the chip size can be greatly reduced. If the multi-value memory cells are used, the memory cell area can be reduced remarkably.

FIG. 4 shows the structure of an equivalent circuit of the imaginary ground type cell array shown in FIG. 1. With reference to FIG. 4, the read-out of the memory cell will now be described.

A plurality of main bit lines (BL) and a plurality of main imaginary ground lines (GL) are alternately arranged in columns. One end of each of both lines is connected to a bias circuit. 32 word lines (WL) are arranged in the row direction so as to cross these lines. Two bank selection lines (SL) are arranged on each of both sides the 32 word lines (WL). The bank selection line SL1 is connected to the bank selection line SL3 to have the same potential, and the bank selection line SL2 is connected to the bank selection line SL4 to have the same potential. The main bit lines and main imaginary ground lines are connected to three sub-bit lines and three sub-ground lines via selection transistors (ST). The selection transistors have their gates connected to the bank selection lines. For example, the selection transistor ST1 is connected to the bank selection line SL4, and the selection transistors ST2 and ST3 are connected to the bank selection line SL3. The memory transistors are connected to the word lines, sub-ground lines and sub-bit lines. Numbers are added to 16 memory transistors connected to the word line WL1, and these are called cell 1, cell 2 . . . , cell 16.

Of the main bit lines BL1 to BL4 and main imaginary ground lines GL1 to GL4, the line GL2 is set at the ground level, i.e, Vss and the line BL2 is connected to the sense amplifier. The line BL3 is set in the floating state. The other main bit lines (BL1 and BL4) and the other main imaginary ground lines (GL1, GL3 and GL4) are biased. If the latter bit lines and ground lines are not biased, a leak current flows to the cells 10 to 14 as with the case of "1" cell (data "1"), as shown in FIG. 9 (this leak current is indicated by symbol Ⓐ). The leak current can be prevented by the bias circuit. In addition, when the cell adjacent to the selected cell is a "1" cell, the unnecessary N⁺ diffusion layer and bit lines are charged to decrease the read operation speed. The above biasing of the bit lines and ground lines avoids this problem by previously charging these lines to increase the read operation speed. When the cell 7, for example, is to be read out, the line SL2 is set at high level to connect the drain of the cell 7 to the line BL2 and the line SL4 is also set at high level to connect the source of the cell 7 to the line GL2. At the same time, the word line WL1 of the 32 word lines WL1 to WL32 is set at high level, the drain of the cell 7 is connected to the sense amplifier via the main bit line SL2. In accordance with the data of the cell 7, the sense amplifier senses "1" or "0".

In the case of the conventional cell array type memory, when the cell 6 is the "1" cell, bias is effected, as shown in FIG. 5. Thus, a leak current Ⓑ flows. Consequently, a current flowing to the drain increases and the drain voltage rises. When the cells 10 and 11 are "1" cells, a leak current Ⓒ flows. Furthermore, when the cells 8, 9, 10 and 11 are "1" cells, a leak current Ⓓ flows. Consequently, since a current Icell flowing to the source of the cell increases, the source potential of the cell rises due to the voltage drop. Accordingly, the current Icell decreases and the drain potential increases. In any case, the leak current acts to raise the drain voltage of the cell. Thus, as compared to the case where the leak path is not provided as shown in FIG. 7, the output potential (Vdatin) of the cell increases. FIG. 6 shows an example of a leak path which is produced when the leak is not due to the bias. Through this leak path, a leak current Ⓔ flows when the cells 8 and 9 are "1" cells and the cell 10 is the "0" cell (data "0"). In this case, since the current Icell increases apparently by the amount corresponding to the leak current, the drain potential decreases.

Accordingly, as shown in FIG. 7, the output (Vdatin) of the cell decreases. In this type of cell array, since the current flowing into the source and drain of the cell varies depending on the state of the surrounding cells, the values of the output potential Vdatin and the current Icell of the cell vary. FIG. 7 is a characteristic graph showing bias-dependency of the output potential. If leak currents Ⓑ to Ⓔ flow, an output potential characteristic curve departs greatly from an ideal one shown by a solid line. If output potentials Vdatin are Vdatin1, Vdain2, Vdain3 and Vdain4, when the threshold voltages vth of the cell are vth1, Vth2, vth3 and vth4, these potentials Vdain due to leak vary as shown in FIG. 8. If the multi-value ROM is realized by this cell array, a margin decreases and practicability lowers. In this bank-type multi-value ROM, the cell arrays are separated by implantation for setting a high threshold value vth. In this case, the threshold voltage Vth is about 5 V at most because of a problem of leak. According to this system, if the gate voltage is raised 5 V or more, the conductivity type of the separation region formed by the high-concentration implantation is reversed and the device is turned on. As a result, a cell array current flows. In addition, if four threshold voltages Vth are to be provided in fabricating the multi-value ROM, four or three masks are required and the manufacturing process is complicated.

SUMMARY OF THE INVENTION

The present invention has been made in consideration of the above problems, and an object of the invention is to provide a large-capacity semiconductor memory apparatus having a cell array structure wherein occurrence of leak current is reduced and a margin at the time of sense operation is increased, with an information amount per one element being equal to an information amount of a plurality of bits.

Another object of the invention is to provide a separation structure for exactly separating cell arrays in the semiconductor memory apparatus and a simple method of setting a threshold.

The present invention is characterized in that selection transistors interposed between one main bit line and at least three sub-bit lines connected to this main bit line are connected to different bank selection lines, and selection transistors interposed between one main ground line and at least two sub-ground lines connected to this main ground line are connected to different bank selection lines. This invention is also characterized in that an insulating oxide film is used as means for separating memory cell array blocks. This invention is also characterized in that two kinds of channel implantations are performed to set four threshold values in a desired memory transistor of a multi-value ROM.

According to this invention, there is provided a semiconductor memory apparatus comprising: a semiconductor substrate; a plurality of sub-bit lines provided on the semiconductor substrate; a plurality of sub-ground lines provided on the semiconductor substrate and arranged alternately with the sub-bit lines; a plurality of memory cells comprising a plurality of memory transistors arranged in a matrix, the memory transistors having drains connected to the sub-bit lines and having sources connected to the sub-ground lines; first selection transistors formed on the semiconductor substrate and connected to the sub-bit lines; second selection transistors formed on the semiconductor substrate and connected to the sub-ground lines; a plurality of word lines connected to gates of the memory transistors and crossing the sub-bit lines and the sub-ground lines; main bit lines each connected to at least three of the sub-bit lines via the first selection transistors; and main ground lines each connected to at least two of the sub-ground lines via the second selection transistors, characterized in that one of the sub-bit lines is selected by one of the first selection transistors, one of the sub-ground lines is selected by one of the second selection transistors, and the first and second selection transistors connected respectively to a predetermined one of the main bit lines and a predetermined one of the main ground lines are connected to different bank selection lines.

Each of the memory transistors has one of four threshold values. The memory cells constitutes memory cell array blocks each comprising a predetermined number of memory cells, the memory cell array blocks are electrically separated, and one of the memory cells of the separated cell array block is selected at the time of a read-out operation. The memory cell array blocks are electrically separated by a field oxide film provided on the semiconductor substrate. The semiconductor substrate is provided with a peripheral circuit region, a device separation insulating oxide film is provided between the peripheral circuit region and a region where the memory cell arrays are formed, and the thickness of the device separation insulating oxide film is equal to or greater than the thickness of the field oxide film provided between the memory cell array blocks.

In addition, according to this invention, there is provided a method of manufacturing a semiconductor memory apparatus, characterized in that in a process of setting a memory cell transistor formed on a semiconductor substrate of the semiconductor memory apparatus at one of four threshold values, the following steps are suitably adopted to set the memory cell transistor at one of the four threshold values:

a step of performing ion implantation in a first dose amount by use of a first mask;

a step of refraining from performing ion implantation in a channel region of the memory transistor on the semiconductor substrate;

a step of performing ion implantation in a second dose amount by use of a second mask; and a step of performing ion implantation in a combination of the first and second dose amounts.

Since one selection transistor selects one sub-bit line or one sub-ground line, a leak path is reduced and a margin at the sensing time is increased. Since transistors, which are connected to sub-bit lines connected to one main bit line or sub-ground lines connected to one main ground line, are different bank selection lines, unnecessary selection transistors are not operated. In addition, since at least three bit lines are connected to one main bit line and at least two sub-ground lines are connected to one main ground line, the number of contacts in a pattern can be reduced. Moreover, in a step of channel implantation, the number of masks can be reduced than in the prior art.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 21A and 21B are characteristic graphs showing a relationship between a dose amount and a threshold voltage in the present invention;

FIGS. 22A and 22B are cross-sectional views showing steps of obtaining four dose amounts by use of two masks in this invention;

FIG. 23 is a cross-sectional view taken along line A—A' in FIG. 15;

FIGS. 24A to 24H are cross-sectional views showing steps of forming a memory cell separation region in this invention.

DETAILED DESCRIPTION OF THE PREFERRED EMBODIMENTS

Embodiments of the present invention will now be described with reference to the accompanying drawings.

Figure 1:
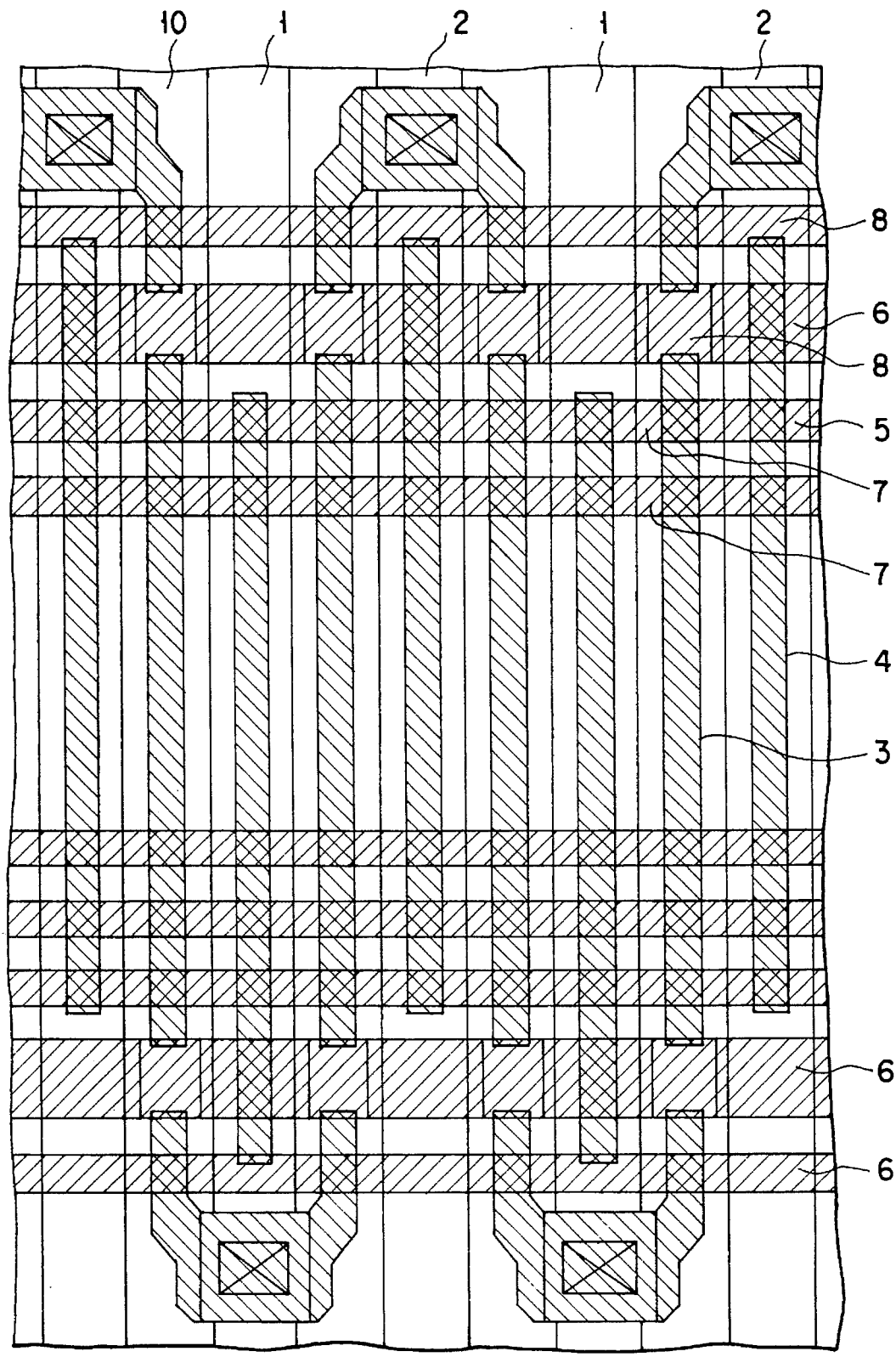
FIG. 1 is a plan view showing a conventional multi-value ROM memory cell array.
Figure 2:
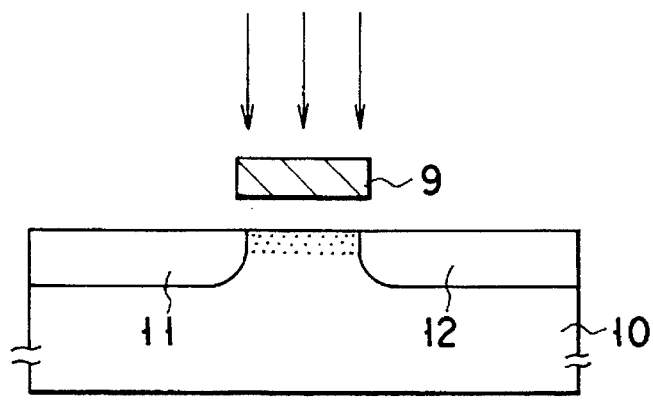
FIG. 2 is a cross-sectional view of a semiconductor substrate, illustrating a channel implantation for setting a threshold value in a conventional memory transistor.
Figure 3:
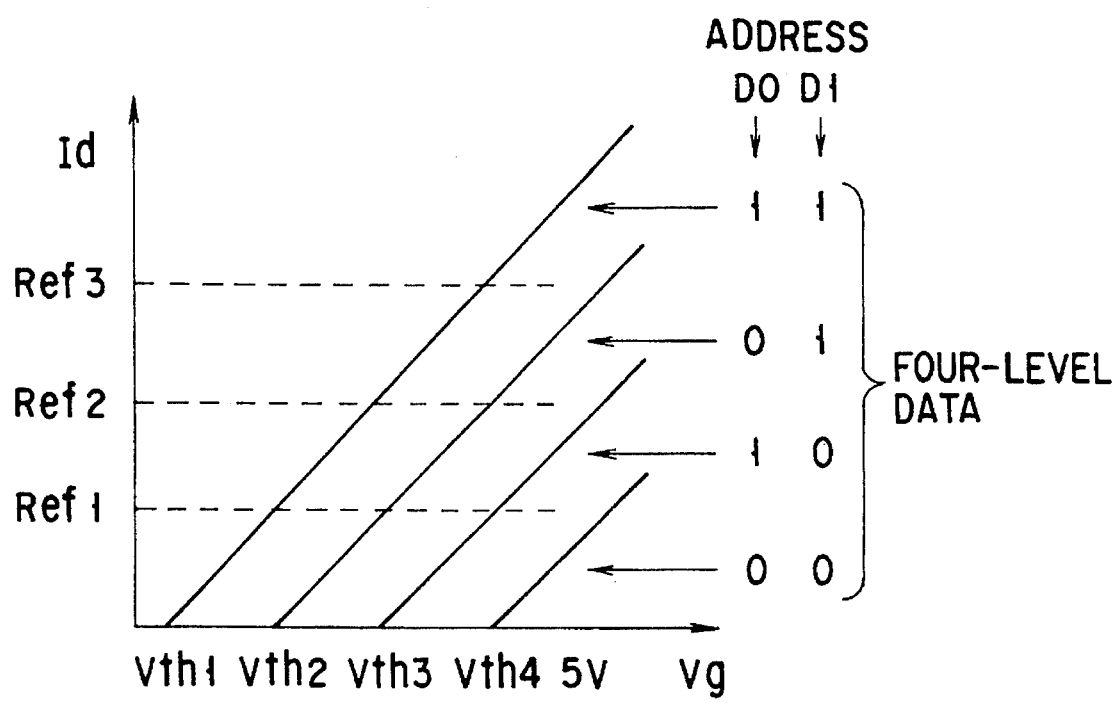
FIG. 3 is a Id-Vg characteristic graph for illustrating conventional four threshold values.
Figure 4:
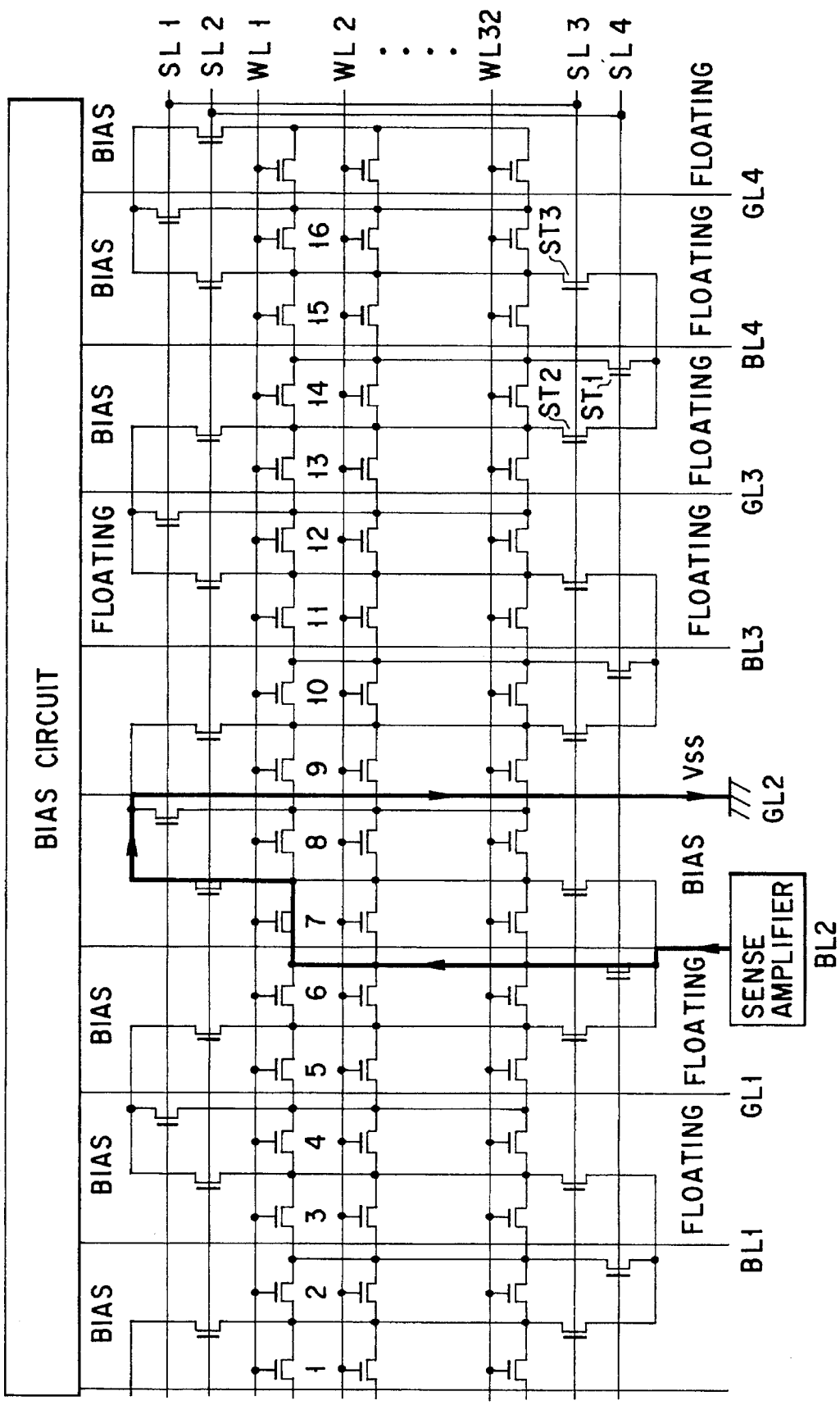
FIG. 4 is a circuit diagram of a conventional memory cell array.
Figure 5:
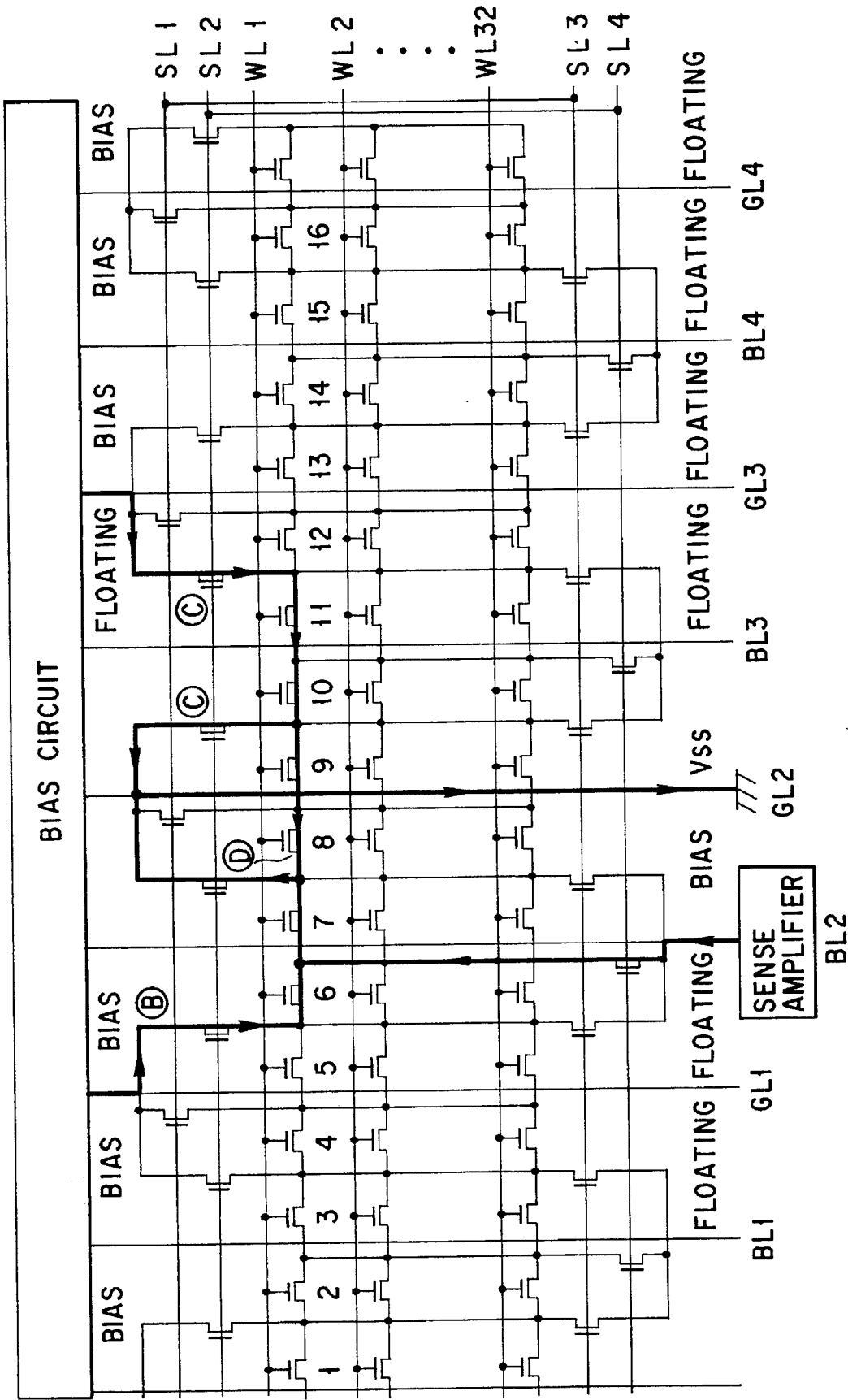
FIG. 5 is a circuit diagram of a conventional memory cell array.
Figure 6:
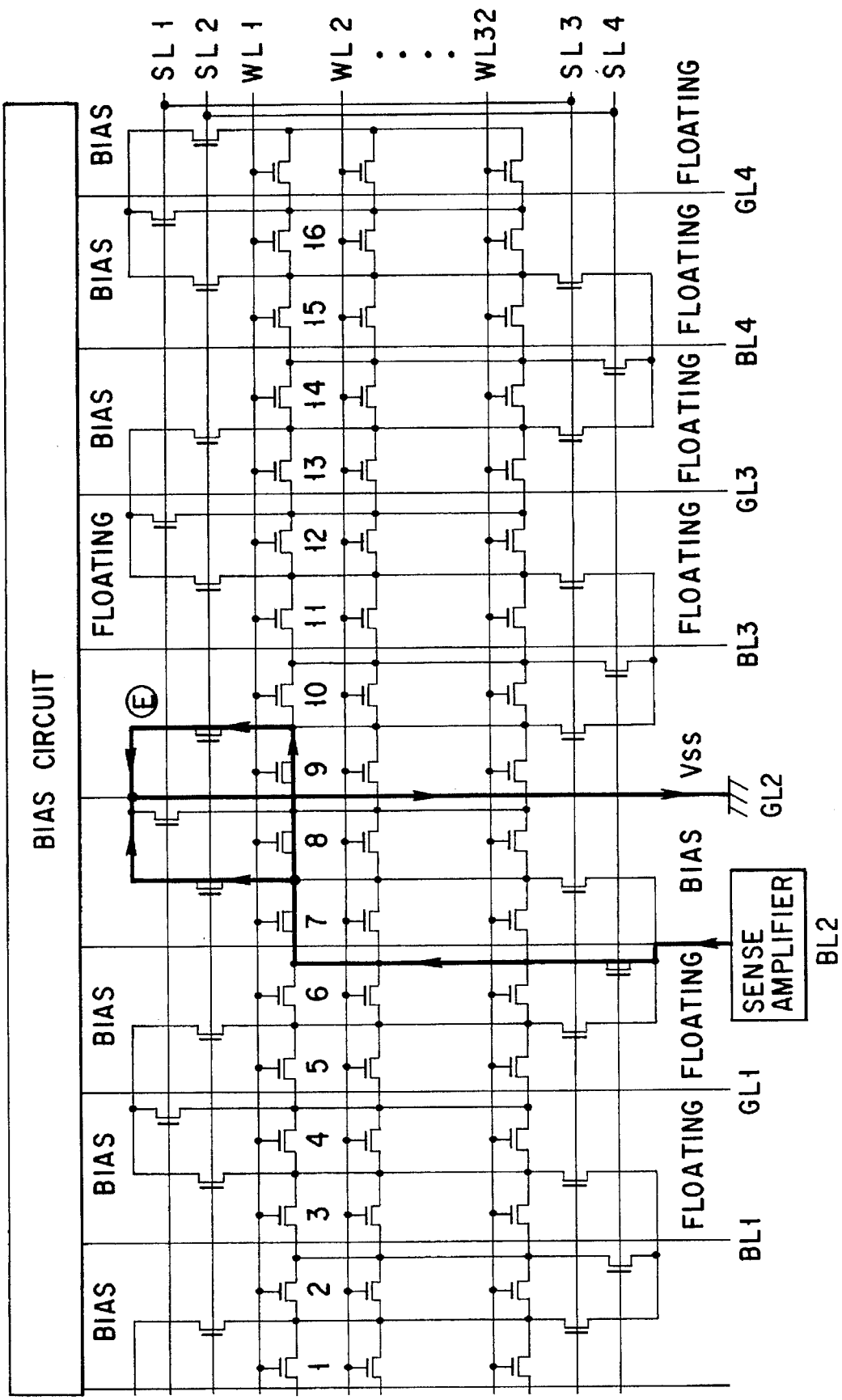
FIG. 6 is a circuit diagram of a conventional memory cell array.
Figure 7:
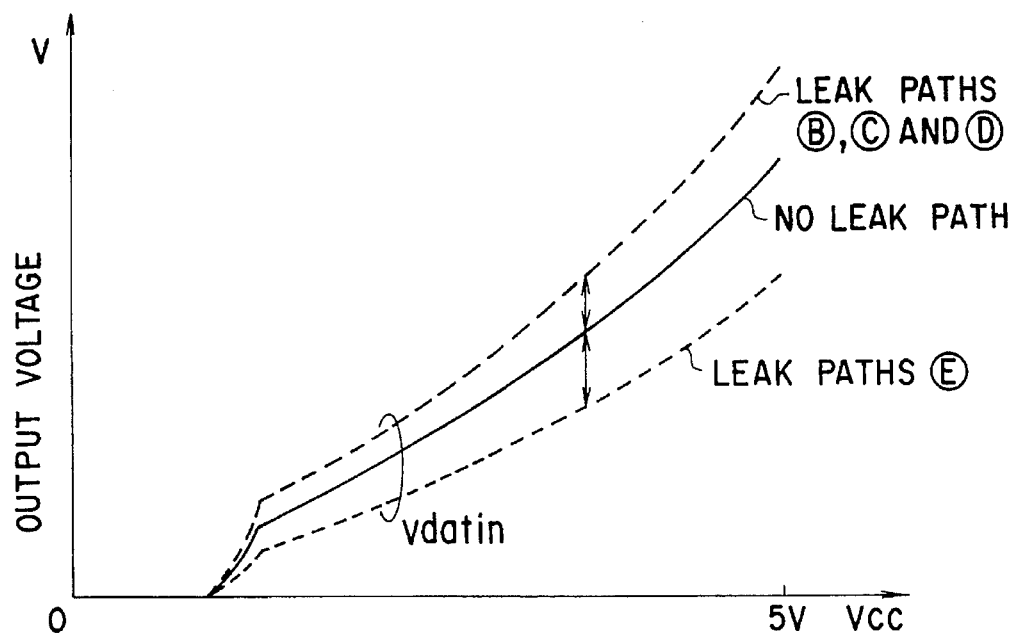
FIG. 7 is a characteristic graph showing a variance among output potentials of memory cells due to a conventional leak path.
Figure 8:
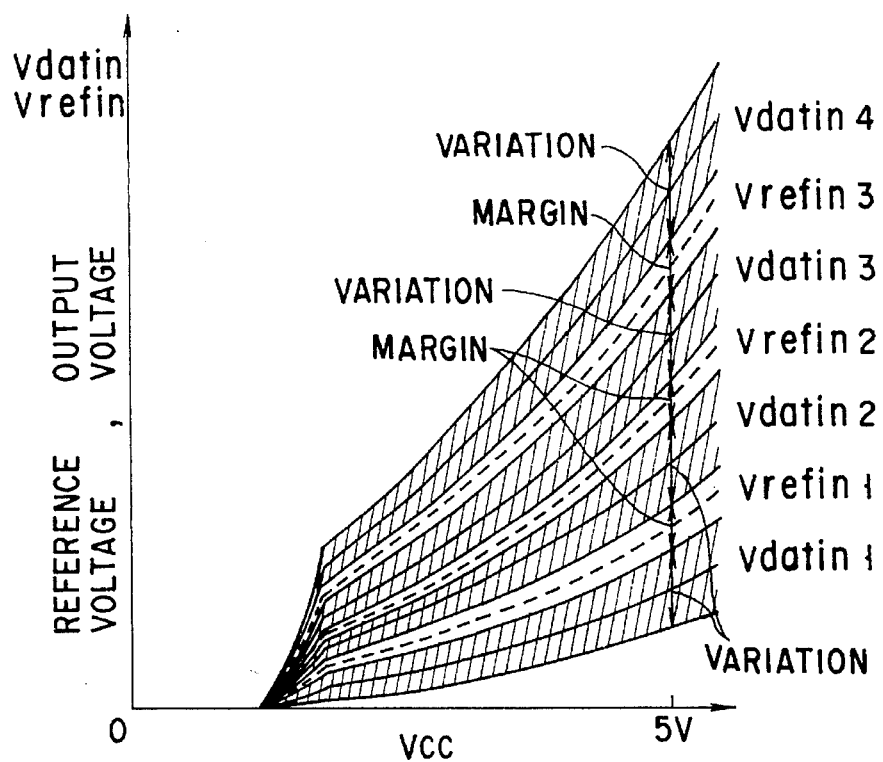
FIG. 8 is a graph illustrating a variance of output potentials of memory cells due to a conventional leak path and a margin.
Figure 9:
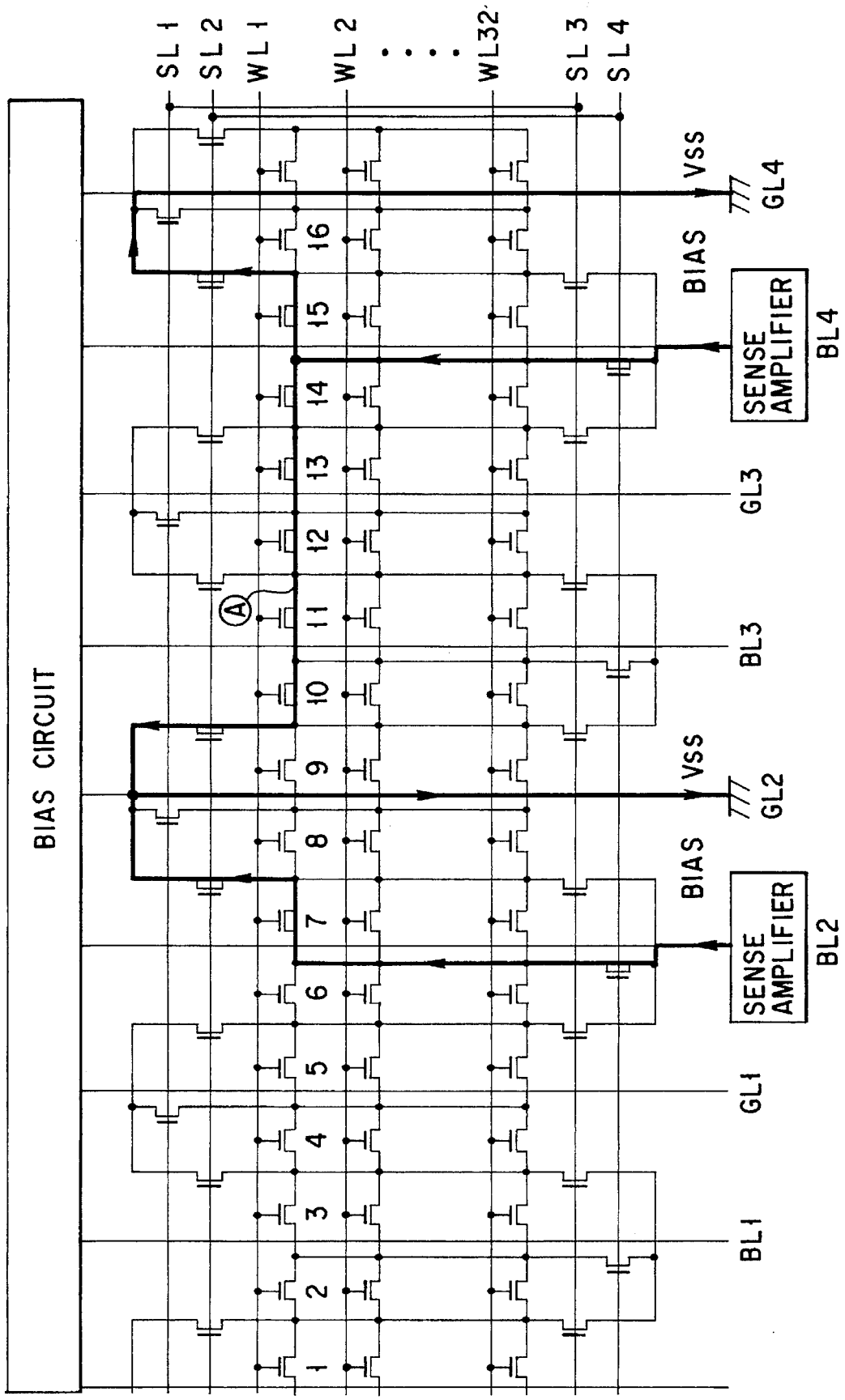
FIG. 9 is a circuit diagram of a conventional memory cell array.
Figures 10, 12:
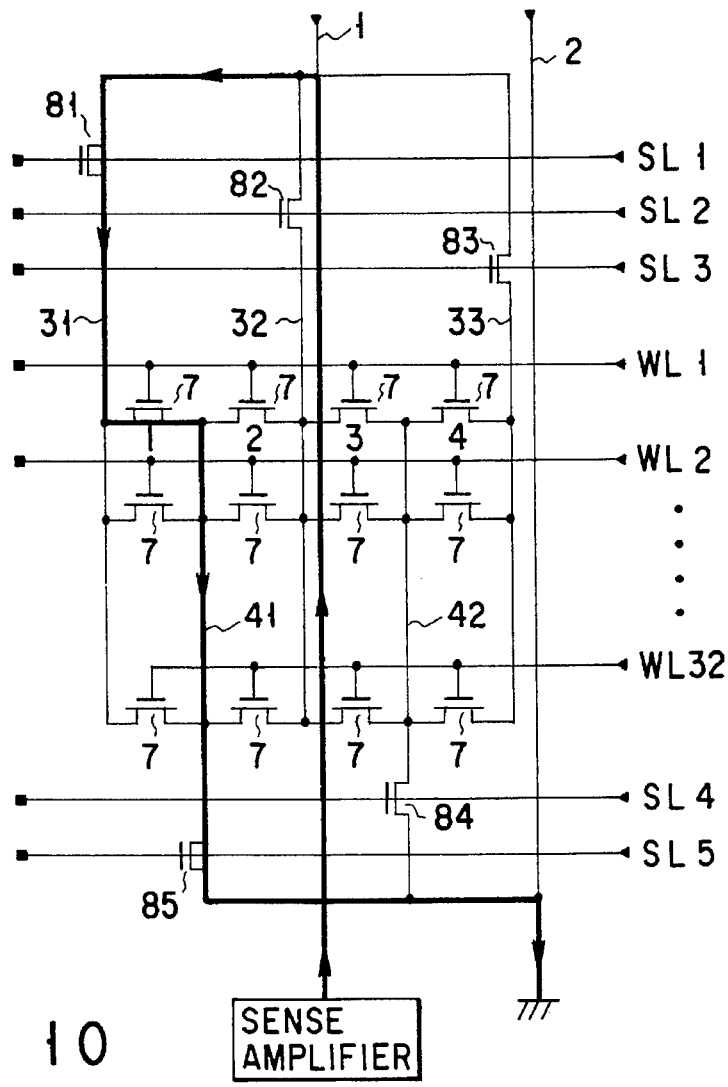
FIG. 10 is a circuit diagram of a multi-value ROM memory cell array according to an embodiment of the present invention.
FIG. 12 shows combinations of selection of bank selection lines at the time of selecting cells shown in FIG. 10.
Figure 11:
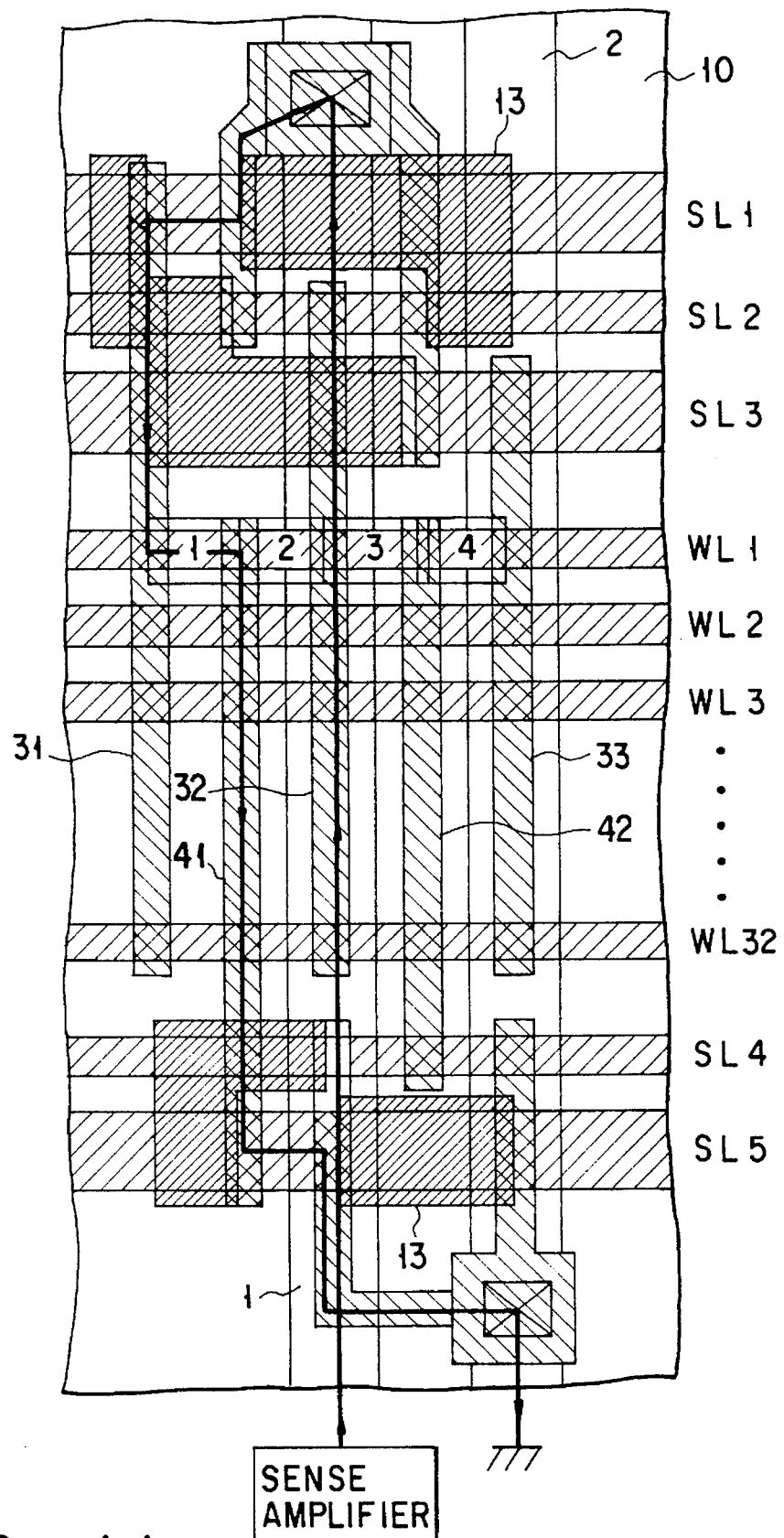
FIG. 11 is a plan view of the multi-value ROM memory cell array shown in FIG. 10.

FIG. 11 is a plan view of a basic pattern of a multi-value ROM cell array of the present invention which is formed on a semiconductor substrate 10, FIG. 10 shows an equivalent circuit thereof, and FIG. 12 shows combinations of selection of bank selection lines at the time of selecting cells in the basic cell array. As is shown in the equivalent circuit diagram of FIG. 10, the basic pattern of FIG. 11 comprises memory transistors 7 arranged in a matrix, first selection transistors 81 and second selection transistors 82. As is shown in FIG. 11, sub-bit lines 3 and sub-ground lines 4 are arrange alternately so as to extend in the column direction. These sub-bit lines 3 and sub-ground lines 4 are formed of an $N^+$ diffusion layer provided on the semiconductor substrate 10. Bank selection lines (SL) and word lines (WL) are arranged in the row direction, and these lines are formed of the same conductive layer as gates of transistors, e.g. a polycide or polysilicon, on the semiconductor substrate. A main bit line 1 and a main ground line 2 are formed in the column direction via an insulating film (not shown) on the semiconductor substrate. The main bit line and main ground line are formed of, e.g. aluminum wires. The main bit line 1 is connected to first, second and third sub-bit lines 31, 32 and 33 via first, second and third selection transistors 81, 82 and 83 and the main ground line 2 is connected to first and second sub-ground lines 42 and 41 via fourth and fifth selection transistors 84 and 85.

For example, read-out of the cell 1 of the memory transistor will now be described. When the bank selection line SL1 of bank selection lines SL1 to SL3 is set at high level, the drain of the cell 1 is connected to the main bit line 1 via the selection transistor 81. When the line SL5 of lines SL4 and SL5 is set at high level, the source of the cell 1 is connected to the main ground line 2. At the same time, if the word line WL1 of 32 word lines WL1 to WL32 is set at high level, a power supply path is formed through the cell 1 via the selection transistor 85. One of the cells 1–4 can be selected by applying potentials to the lines SL1 to SL5 in combinations shown in FIG. 12 (symbol "o" indicates a high level, and absence thereof indicates a low level).

Figure 13:
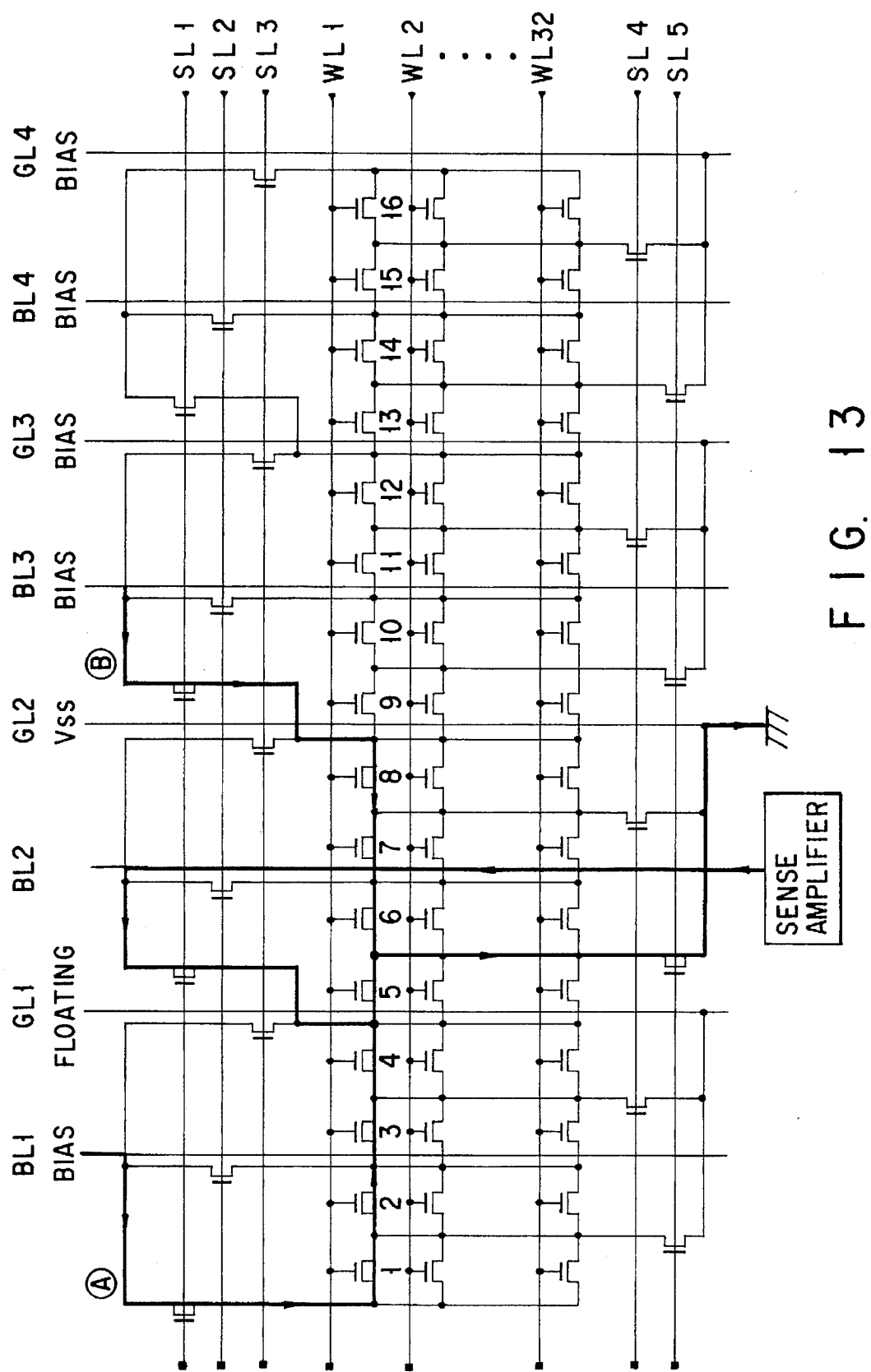
FIG. 13 is a circuit diagram of a memory cell array according to a first embodiment of the present invention.

A semiconductor memory apparatus according to a first embodiment of the present invention will now be described with reference FIG. 13. The semiconductor memory apparatus shown in FIG. 13 is constituted by the above-described cell array. In particular, FIG. 13 shows a current path for reading out data from the memory cell array by a conventional bias method. In this description, the cell "5" is read out. The line SL1 of lines SL1 to SL3 is selected and set at high level. The line SL5 of lines SL4 and SL5 is selected and set at high level. The line WL1 of lines WL1 to WL32 is selected and set at high level. Furthermore, the main ground line GL2 is set at a ground level (Vss) and the main bit line BL2 of main bit lines BL1 to BL4 is connected to the sense amplifier to flow a current from the sense amplifier. The main ground line GL1 is made in the floating state and the other main bit lines (BL1, BL3 and BL4) and the other main ground lines (GL3 and GL4) are set in the bias state.

Since the number of bank selection lines is increased by one in the present invention, as compared to the prior art, a leak path can be eliminated by cutting off a parasitic leak path. In addition, a leak path near the selection transistor can be cut off by an implantation stopper region 13 (FIG. 15) formed with a high threshold. As is clear from FIG. 13, by applying a bias, a leak current in leak path Ⓐ occurs and flows into the cell 5 when the cells 1 to 4 are "1" cells. Consequently, the current flowing into the cell 5 increases and the drain voltage of the cell 5 rises. When the cells 6 to 8 are "1" cells, a leak current in leak path Ⓑ flows and the source potential of the cell rises due to voltage drop. Accordingly, since the flow-out current from the cell decreases and the flow-in current is unchanged, the drain voltage of the cell rises. Because of these factors, the Icell value and output potential of the cell vary due to the condition of the adjacent cells.

Figure 14:
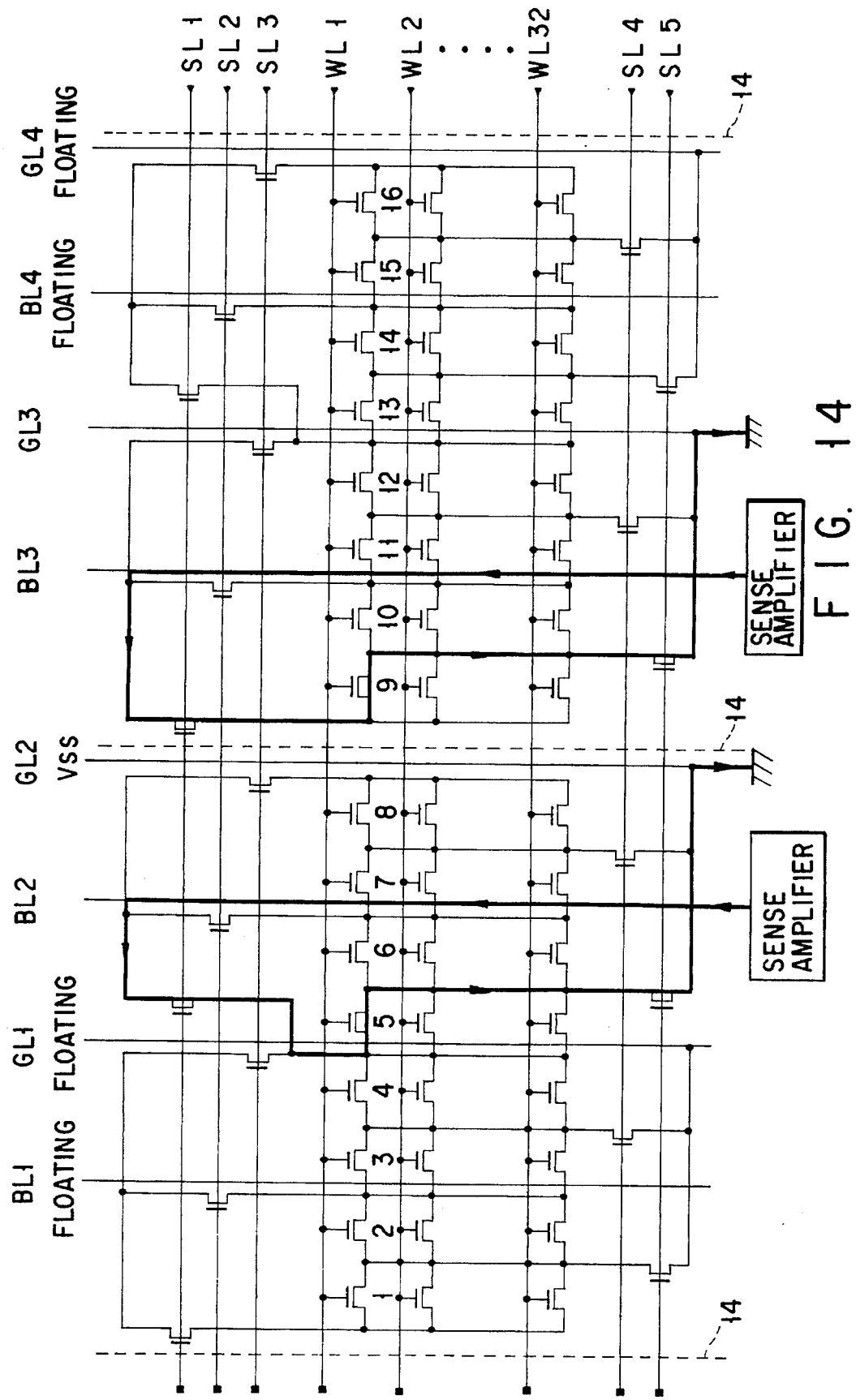
FIG. 14 is a circuit diagram of a memory cell array according to a second embodiment of the present invention.
Figure 15:
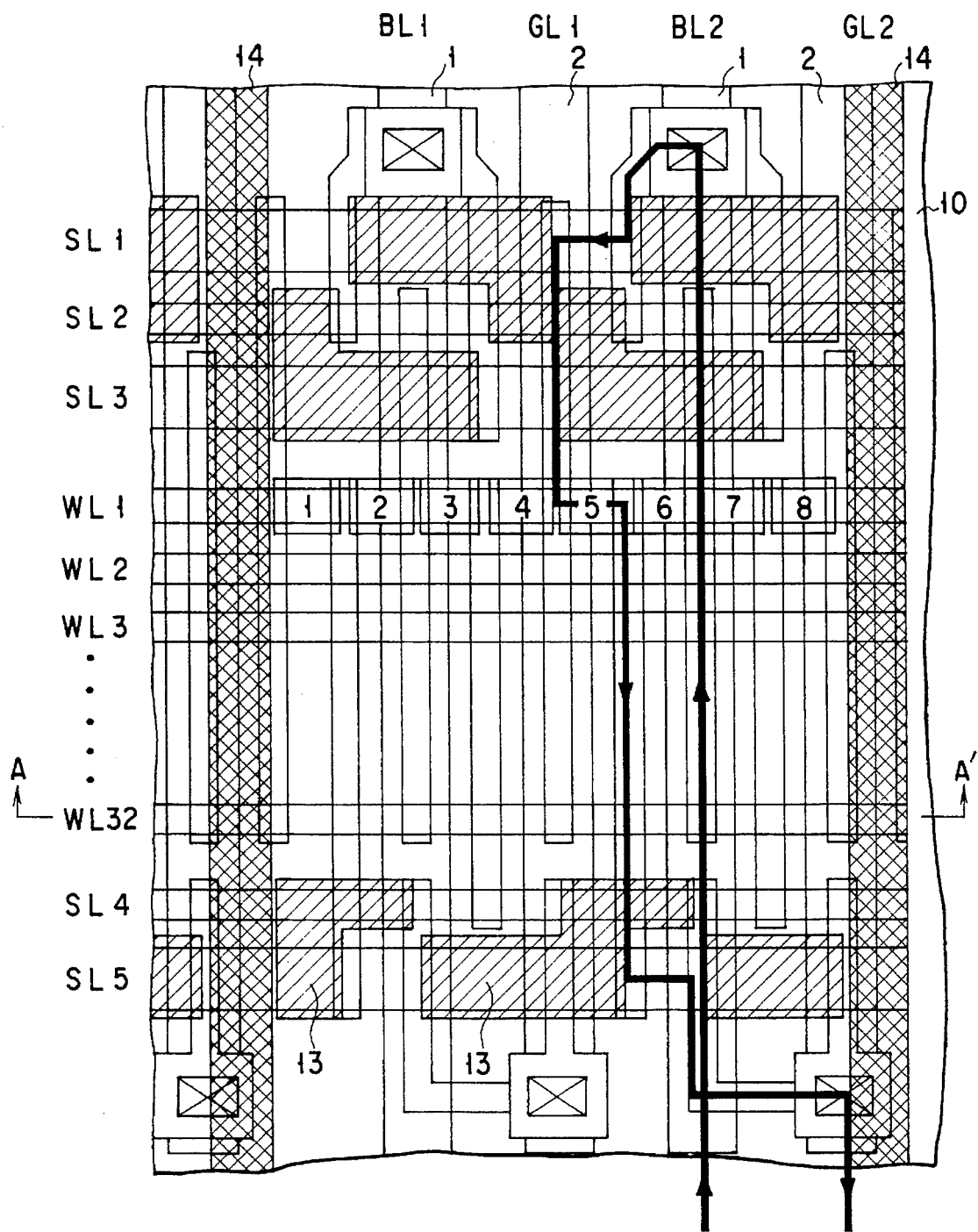
FIG. 15 is a plan view of the memory cell array shown in FIG. 14.
Figure 16:
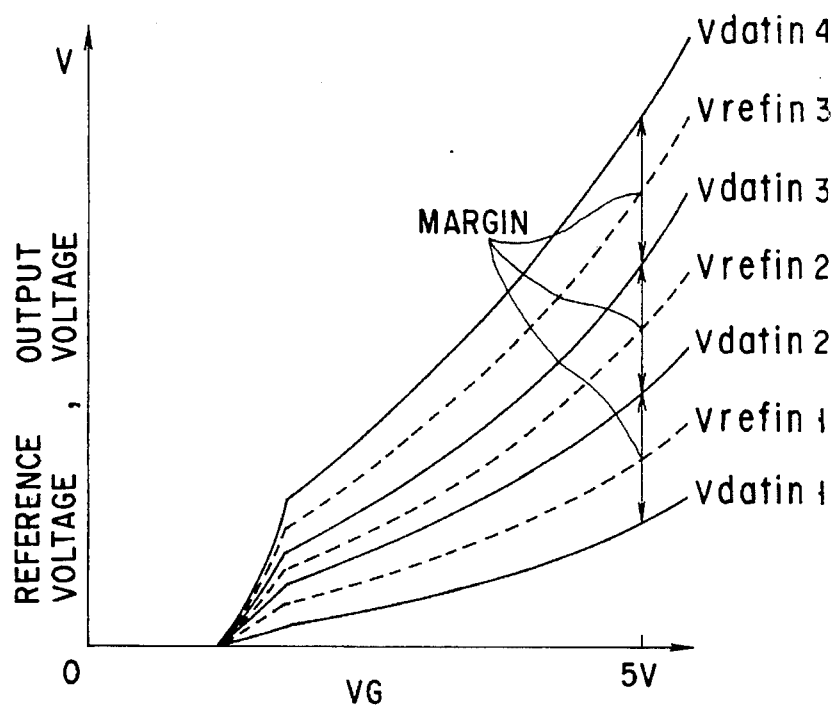
FIG. 16 is a characteristic graph illustrating an output potential of the memory cell array shown in FIG. 15 and a margin.

A semiconductor memory apparatus according to a second embodiment of the present invention will now be described with reference to FIGS. 14 to 16. FIG. 15 is a plan view of a basic pattern of a cell array structure of a multi-value ROM formed on a semiconductor substrate 10, FIG. 14 shows an equivalent circuit thereof, and FIG. 16 is a characteristic diagram for illustrating an output potential and a margin of the memory cell of this embodiment. In the preceding embodiment, the Icell value and output potential of the cell vary due to the condition of adjacent cells since leak paths Ⓐ and Ⓑ are left. In this embodiment, in order to solve this problem, the bias method is not adopted. Instead, the cell arrays each comprising 8 cells are electrically separated by a dividing portion 14. Thereby, flowing-in of a leak current from an adjacent cell array block is prevented. For example, in the method of electrical separation, a separation region may be formed simultaneously by implantation for ROM, or it may be formed in a step different from ROM implantation.

The read-out of the cell 5 will now be described. The line SL1 among lines SL1 to SL3 is selected and set at high level. The line SL5 of lines SL4 and SL5 is selected and set at high level. Then, the line WL1 among lines WL1 to WL32 is selected and set at high level. The line GL2 is set at a ground level, the line BL2 is selected, and a bias current is let to flow from the sense amplifier via the line BL2. At the same time, the bit line (BL1) and ground line (GL1) other than the lines BL2 and GL2 are set in the floating state. Thereby, a leak current is stopped by charging the bit lines BL1 and BL2 and the junction between the $N^+$ diffusion layer and P-type semiconductor substrate in the same cell array block and the leak current does not flow in the normal state. Thereby, the current path as shown in FIG. 14 is obtained, and a cell array having no leak path is achieved. As a result, a margin at the sensing time, which occurs in fabricating the multi-value ROM, can be increased as shown in FIG. 16. In this case, too, an implantation stopper 13 is formed at a suitable location.

In this embodiment, the separation region is formed for every 8 cells. Specifically, the basic pattern of the memory cell array is formed for every 8 banks. In the present invention, the size of the area of one memory cell array is not limited, and one memory cell array may comprise any number of banks.

Figure 17:
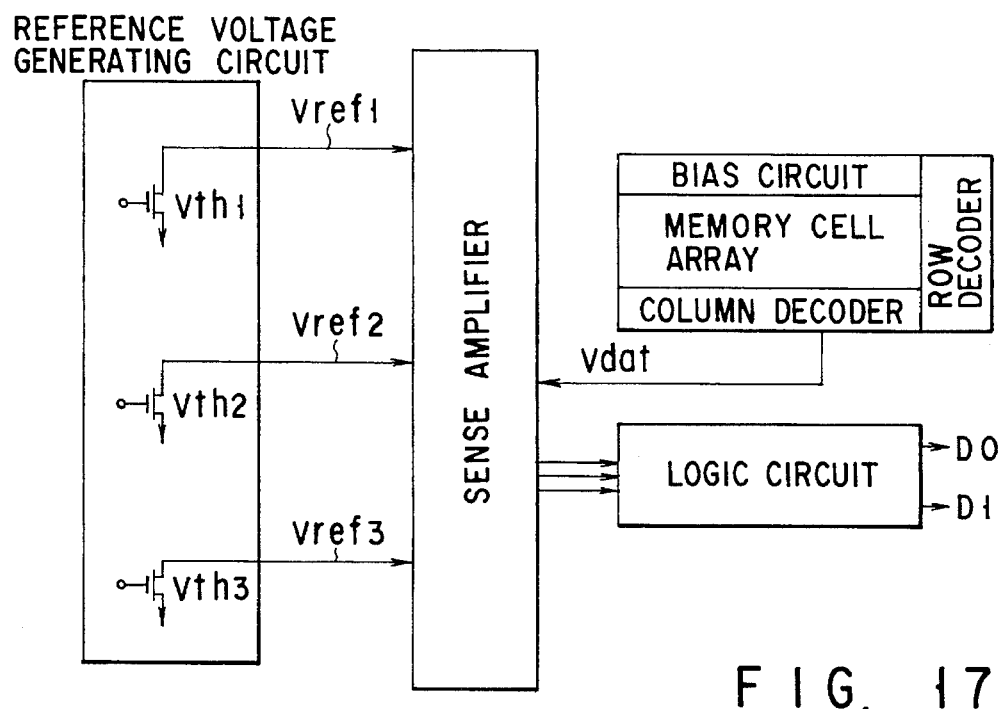
FIG. 17 is a block diagram showing a basic structure of the multi-value ROM of the present invention.
Figure 18:
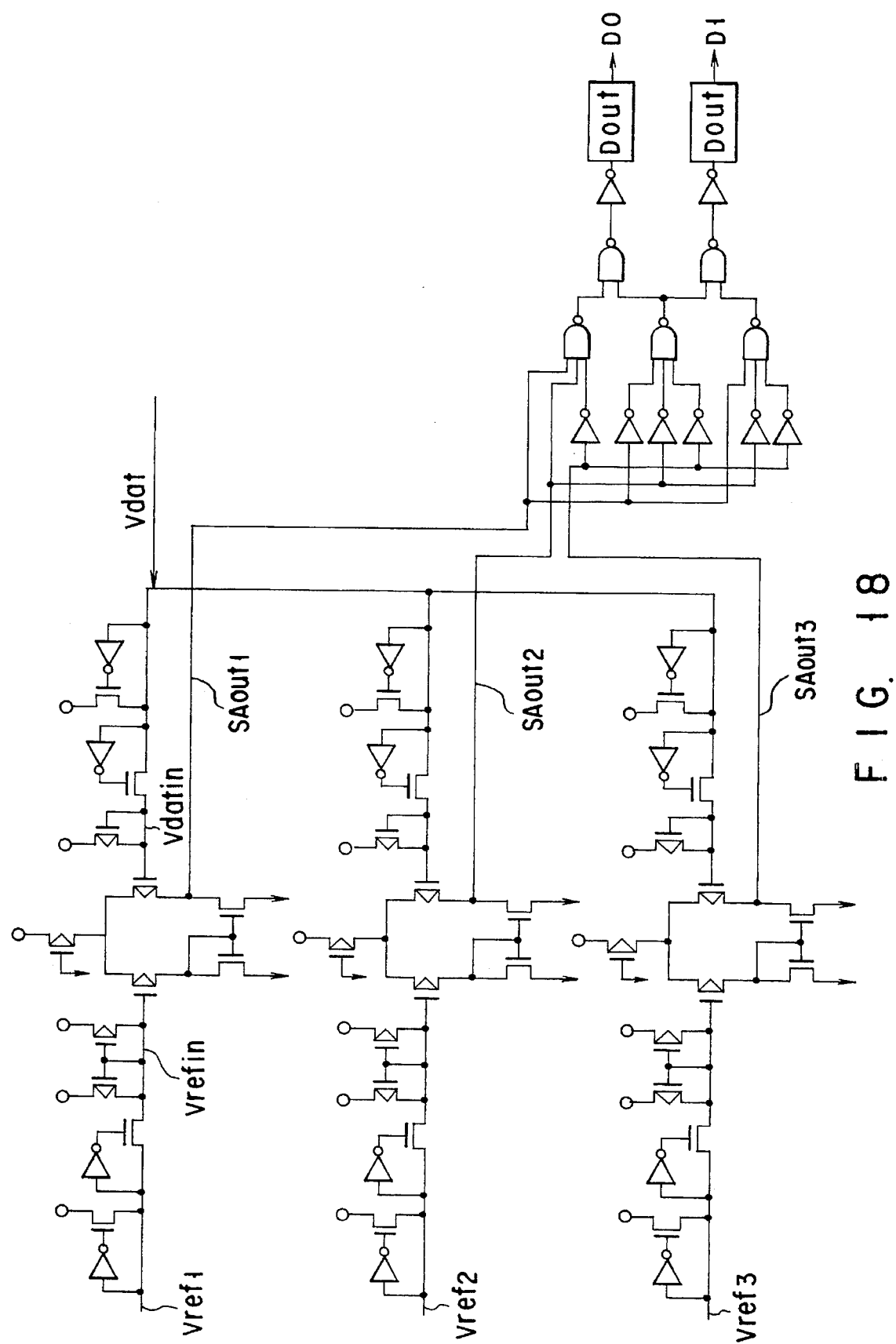
FIG. 18 is a circuit diagram showing an example of an internal structure of a sense amplifier and a logical circuit shown in FIG. 17.

In the ROM of the present invention, multi-value data in the memory cell is detected by a circuit structure shown in FIG. 17. A memory portion of the ROM comprises a memory cell array, in which the memory cells are arranged in a matrix, a row decoder for controlling word lines to which the gates of the memory cells are commonly connected, a column decoder for controlling bit lines, and a bias circuit for biasing the bit lines. The memory portion is connected to a sense amplifier via bit line selection transistors. In this case, three sense amplifiers are required for sensing four different threshold voltages. Each sense amplifier receives three different references (Vref1, Vref2, Vref3). A logical circuit is provided for matching outputs of the three sense amplifiers with two addresses D0 and D1. A reference voltage generating circuit for setting three reference levels generates a reference voltage Vref1 by using memory cells with threshold voltage Vth1, a reference voltage Vref2 by using memory cells with threshold voltage Vth2, and a reference voltage Vref3 by using memory cells with threshold voltage Vth3. Based on these reference voltages, outputs to be supplied to the logical circuit are generated. The reference voltages are input to the sense amplifier and compared with output voltage Vdat supplied to the amplifier from the memory cells. A comparison result is input to the logical circuit, and data items (00, 01, 10, 11) corresponding to two addresses D0 and D1 are read out by the logical circuit. FIG. 18 shows examples of the sense amplifier and the logical circuit for outputting data. Outputs of the sense amplifier are denoted by SAout 1, SAout 2 and SAout 3.

By the above structure, two-bit data can be read out from a one-bit memory cell, and double the amount of data can be stored in the memory cell of the same chip size as in the prior art. In other words, the chip size can be reduced remarkably if the memory capacity remains the same as in the prior art. If the multi-value memory cell is used, the area of the memory cell can be reduced very much.

A method of manufacturing the apparatus of the present invention will now be described. FIG. 15 is a plan view of the basic pattern of one memory cell array of the four-value level type ROM of this invention. The memory cell array block is separated from other memory cell array blocks by the separation region 14 made of, e.g. an insulating oxide film. The array block in this figure corresponds to the left half of the equivalent circuit shown in FIG. 14. Only memory transistors connected to the word line WL1 are accompanied with cell numbers 1 to 8, and the memory transistors connected to word lines WL2, WL3 . . . WL32 are not shown. Each transistor has any one of four threshold values so that one cell (one transistor) may have four states, i.e. 2-bit data, and the memory capacity is doubled, as compared to the conventional 1-cell 1-bit memory. The threshold value is shifted by channel doping by means of an ion implantation process.

Figure 19:
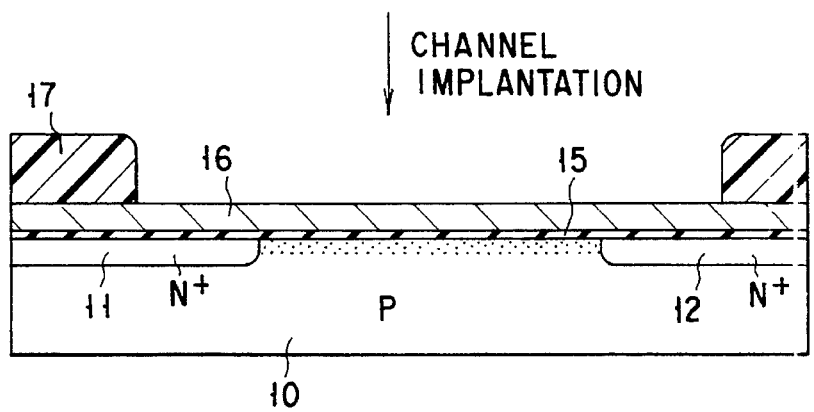
FIG. 19 is a cross-sectional view of a semiconductor substrate, illustrating a channel implantation for setting a threshold value in the memory transistor of the present invention.

With reference to FIG. 19, the channel implantation for the memory transistor will now be described. FIG. 19 is a partial cross-sectional view of a region of P-type silicon semiconductor substrate, where a memory transistor is formed. A source/drain region 11, 12 made of an $N^+$ diffusion layer is formed in a surface portion of the semiconductor substrate 10. A gate oxide film 15 is formed thereon. Further, a polysilicon film 16 is coated on the gate oxide film 15. A photoresist film 17 is provided on the polysilicon film 16 except for an area where impurities are ion-implanted ("channel implantation"). In this state, channel implantation is effected on the channel surface via the gate oxide film 15 and polysilicon film 16, thereby varying the threshold of the transistor.

Figure 20A:
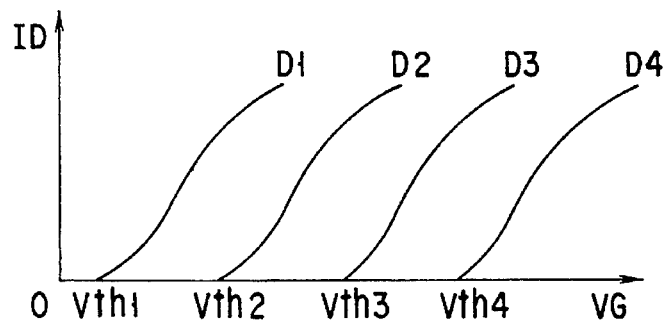
FIGS. 20A to 20C are characteristic graphs showing Vg-Id characteristics of memory cells according to different methods of ion implantation of the multi-value ROM of this invention.
Figure 20B:
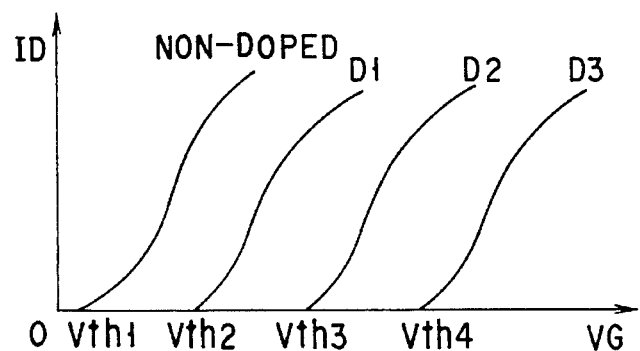
Figure 20C:
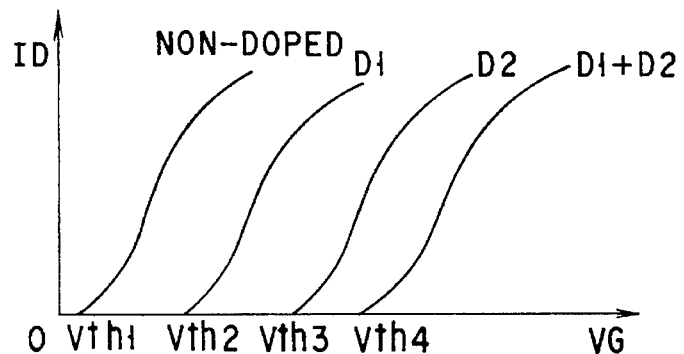

Referring to FIGS. 20A, 20B and 20C, a method of making the memory cells (memory transistors) have four thresholds will now be described. FIG. 20A illustrates a method of obtaining four thresholds by performing channel implantation of four dose amounts D1, D2, D3 and D4 (D1<D2<D3<D4), with four masks provided over the channel region. FIG. 20B illustrates a method in which one of four thresholds is provided even if channel implantation for setting a threshold is not performed. Accordingly, it should suffice if channel implantation is performed three times. Thus, the channel implantation with three does amounts D1, D2 and D3 is performed by use of three masks, thereby obtaining four threshold values. FIG. 20C illustrates a method in which a cell in which no ion implantation is performed, cells in which ion implantation is performed with two does amounts D1 and D2 with use of two masks, and a cell in which double implantation is performed with a total dose amount of D1+D2 are combined to obtain four thresholds. The number of necessary ROM data masks for performing channel implantation is four in the method (a), three in the method (b), and two in the method (c). Accordingly, in the case of (c), TAT (Turn Around Time) is shortest and a lot cost is low and advantageous.

With reference to FIGS. 21A and 21B, a specific example of the method illustrated in FIG. 20C will now be described. FIG. 21A is a characteristic graph showing threshold-dependency of a ROM dose amount. When channel implantation is not performed, the threshold is 1 V. When the ROM dose amount is D1, the threshold value is 1.8 V, as shown in FIG. 21B. When the dose amount is D2, the threshold is 2.5 V. In the case of double implantation with dose amounts of D1+D2, the threshold is 3.0 V. Only by performing ion implantation twice, can four thresholds of 1 V, 1.8 V, 2.5 V and 3.2 V be obtained.

FIGS. 22A and 22B show an example of a process for obtaining four thresholds with use of only two ROM data masks as shown in FIG. 20C. Cells 1, 2, 3 and 4 having $N^+$ diffusion source/drain regions are formed on a P-type semiconductor substrate 10. By using a ROM mask 18, ion implantation with dose amount D1 is performed. Since the mask 18 has openings corresponding to the cells 2 and 4, ions are implanted in channel regions of these cells. Then, by using a ROM mask 19 having openings corresponding to the cells 3 and 4, ion implantation is performed with dose amount D2. Thus, the respective cells have four different thresholds.

As is shown in FIGS. 14 and 15, the cell arrays each comprising 8 cells are separated by the separation region 14 to form individual cell array blocks. This construction is adopted in order to prevent a leak current from flowing into the adjacent cell array block. Conventionally, this separation is effected by simultaneously performing implantation on the separation region and the channel, thereby raising the threshold of this region. However, if ROM implantation is performed at high acceleration and high density to obtain a threshold voltage of about 7 V to 8 V, the silicon semiconductor substrate is damaged and a defective crystal may form. This may result in a leak current which occurs when a bias is applied to the drain of the memory cell. Specifically, in the prior art, a leak current flows in the turn-off state with high Vth, and erroneous data is output. To avoid this, implantation is effected to obtain a threshold of about 5 V. The problem with this is the operation of the cell when Vcc is 5 V or more and in the vicinity of a maximum. If Vcc rises up to Vth or above, the cell turns on and a current flows. In such a case, the separation is not achieved, resulting in a malfunction. In the present invention, blocking of current is achieved by field separation, i.e. thickening an oxide film in this region.

Figure 24G:
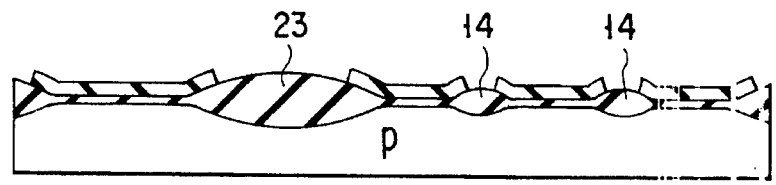

FIG. 23 is a cross-sectional view taken along line A—A' in FIG. 15. As seen from FIG. 23, in a separation region 14, a silicon oxide film is thickened and an adjacent cell array block is separated. Thereby, even if the word line potential is 5 V or above, separation is ensured. Thus, current leakage from the adjacent cell array block at the read time can be prevented. Eight transistors are formed between silicon oxide films 14 of the separation regions. The semiconductor substrate 10 is coated with a gate oxide film 15, and a word line 5 made of a polycide (i.e. a composite film of polysilicon and silicide) is provided on the gate oxide film 15. FIGS. 24A to 24H illustrate steps of a process for achieving cell separation. In order to prevent an increase in cell area, a silicon oxide film in the separation region is thinner than a field oxide film. A P-type silicon semiconductor substrate 10 includes a cell region and a peripheral circuit region. A silicon thermal oxide film 20 about 100 nm thick is formed on the substrate 10. A nitride film ($Si_3N_4$) 21 about 200 nm thick is grown on the oxide film 20 by CVD (FIG. 24A).

Figure 24H:
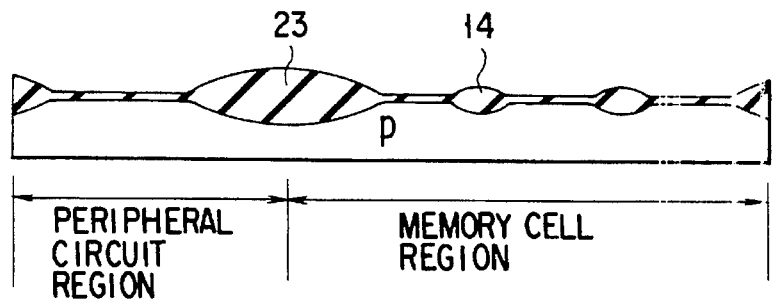

Then, a photoresist film 22 patterned by a predetermined mask process is formed on the nitride film 21 (FIG. 24B). With the photoresist film 22 used as a mask, the nitride film on the device separation region is partly etched away (FIG. 24C). Thereby, the device formation region and device separation region (field region) are defined. The photoresist film 22 is then removed, and the surface of the semiconductor substrate 10 is thermally oxidized once again, thereby forming a field oxide film 23 about 1 µm thick on the device separation region (FIG. 24D). The nitride film 21 functions as oxidation prevention member. Subsequently, a photoresist film 24 patterned by a mask process is formed (FIG. 24E). With the photoresist film 24 used as a mask, the nitride film on the memory cell array separation region is partly etched away (FIG. 24F). Then, the photoresist film 24 is removed, and the surface of the semiconductor substrate 10 is thermally oxidized once again. Thereby, an oxide film 14 thinner than the field oxide film 23 is formed on the memory cell array separation region (FIG. 24G). Lastly, the nitride film ($Si_3N_4$) on the semiconductor substrate 10 is removed (FIG. 24H).

Figure 25A:
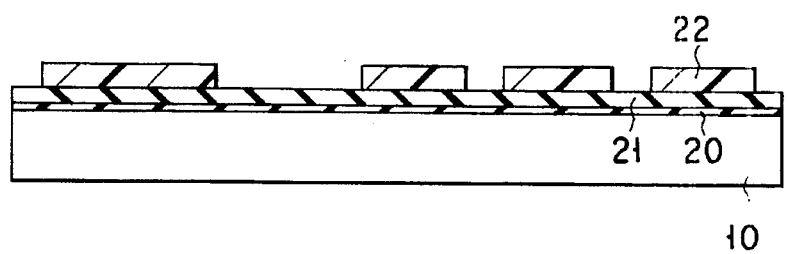
FIGS. 25A to 25D are cross-sectional views showing steps of forming a memory cell separation region in this invention.
Figure 25B:
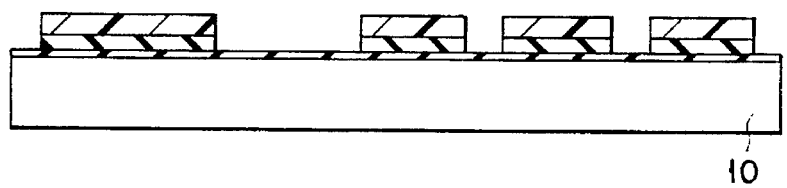
Figure 25C:
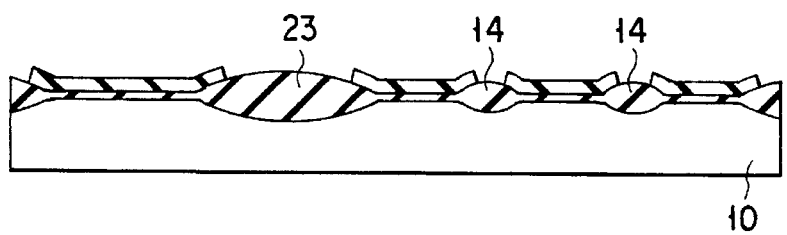
Figure 25D:
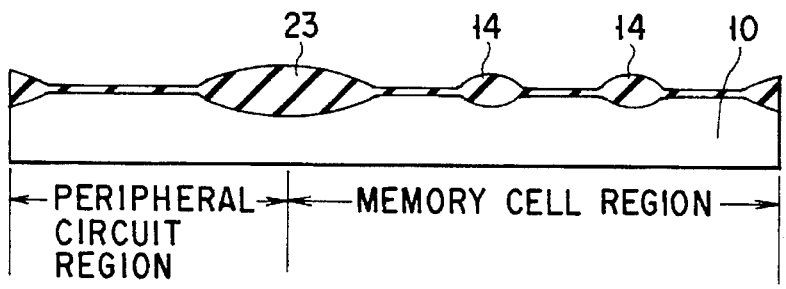

With reference to FIGS. 25A to 25D, another method of forming a field oxide film will now be described. According to this method, in order to reduce the number of photoetching processes (PHP), a cell array block separation field is formed simultaneously with formation of the field oxide film. A thermal oxide film 20 and a nitride film 21 are formed on a semiconductor substrate 10 and a photoresist film 22 is formed on the resultant structure, in the same manner as the above-described method (FIG. 25A). With the photoresist film 22 used as a mask, the nitride film on the device separation region and memory cell array separation region is partly etched away (FIG. 25B). The photoresist film 22 is removed and then the surface of the semiconductor substrate 10 is thermally oxidized. Thereby, field oxide films 23 and 14 about 1 µm thick are formed on the device separation region and memory cell array separation region (FIG. 25C). The nitride film 21 functions as oxidation prevention member. Lastly, the nitride film on the semiconductor substrate 10 is removed (FIG. 25D).

In the present invention, the separation region may be an insulating film of a trench structure. By forming the device separation region and memory cell array separation region in a trench structure, the integration density can be increased further. In this case, too, the depth of the trench between the memory cell arrays may be slightly greater than the depth of the impurity diffusion layer, which constitutes the source/drain region, etc. of the transistor, from the surface of the semiconductor substrate. It is not necessary, therefore, that the depth of the trench be substantially the same as the depth of the oxide film of the insulation separation region formed between the peripheral circuit region and the memory cell region.

As has been described above, the adjacent memory cell array blocks are separated by the field oxide film, one main bit line is connected to at least three sub-bit lines, one main ground line is connected to at least two sub-ground lines, and the number of bank selection lines is increased. Thereby, a parasitic leak path is cut off, and a multi-value ROM which needs to sense a plurality of cell currents is obtained. In addition, the cell transistor which can have four threshold values can be manufactured with a less number of ROM data masks.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory apparatus comprising:

a semiconductor substrate;

a plurality of sub-bit lines provided on said semiconductor substrate;

a plurality of sub-ground lines provided on said semiconductor substrate and arranged alternately with said sub-bit lines;

a plurality of memory cells comprising a plurality of memory transistors arranged in a matrix, said memory transistors having drains connected to said sub-bit lines and sources connected to said sub-ground lines, said plurality of memory cells constituting a plurality of memory cell array blocks each comprising at least three memory transistors, each of three memory transistors within one of said memory, cell array blocks having threshold values different from one another;

means for electrically separating one of said memory, cell array, blocks from another of said memory cell array blocks;

first selection transistors formed on said semiconductor substrate and connected to said sub-bit lines;

a second selection transistors formed on said semiconductor substrate and connected to said sub-ground lines;

a plurality of word lines connected to gates of said memory transistors and crossing said sub-bit lines and sub-ground lines;

a plurality of first selection lines connected to gates of said first selection transistors and crossing said sub-bit lines;

a plurality of second selection lines connected to gates of said second selection transistors and crossing said sub-ground lines;

main bit lines each connected to at least three of said sub-bit lines via said first selection transistors; and main ground lines each connected to at least two of said sub-ground lines via said second selection transistors, wherein one of said sub-bit lines is selected by one of said first selection transistors, one of said sub-ground lines is selected by one of said second selection transistors, and said first selection transistor connected to a predetermined one of said main bit lines is respectively connected to said first selection lines and said second selection transistors connected to a predetermined one of said main ground lines is respectively connected to said second selection lines.

2. A semiconductor memory apparatus according to claim 1, wherein said means for electrically separating comprises an insulation oxide film formed on said semiconductor substrate.

3. The semiconductor memory apparatus according to claim 2, wherein said semiconductor substrate is provided with a peripheral circuit region, a device separation insulating oxide film is provided between the peripheral circuit region and a region where the memory cell arrays are formed, and the thickness of the device separation insulating oxide film is equal to or greater than the thickness of the insulation oxide film formed on said semiconductor substrate.

4. A semiconductor memory apparatus according to claim 1, further comprising a sense amplifier provided with at least two reference signals and with a data signal output from said plurality of memory cells, said sense amplifier providing an output signal based on a comparison between said at least two reference signals and said data signal.

5. A semiconductor memory comprising:

a semiconductor substrate;

a plurality of sub-bit lines provided on said semiconductor substrate;

a plurality of sub-ground lines provided on said semiconductor substrate and arranged alternately with said sub-bit lines;

a plurality of memory transistors arranged in a matrix, said memory transistors having drains connected to said sub-bit lines and sources connected to said sub-ground lines, said plurality of memory transistors constituting a plurality of memory cell array blocks each comprising at least three memory transistors;

means for electrically separating one of said memory cell array blocks from another of said memory cell array blocks;

first selection transistors formed on said semiconductor substrate and connected to said sub-bit lines;

a second selection transistors formed on said semiconductor substrate and connected to said sub-ground lines;

a plurality of word lines connected to gates of said memory transistors and crossing said sub-bit lines and sub-ground lines;

a plurality of first selection lines connected to gates of said first selection transistors and crossing said sub-bit lines;

a plurality of second selection lines connected to gates of said second selection transistors and crossing said sub-ground lines;

main bit lines each connected to at least three of said sub-bit lines via said first selection transistors; and main ground lines each connected to at least two of said sub-ground lines via said second selection transistors, wherein one of said sub-bit lines is selected by one of said first selection transistors, one of said sub-ground lines is selected by one of said second selection transistors, and said first selection transistor connected to a predetermined one of said main bit lines is respectively connected to said first selection lines and said second selection transistors connected to a predetermined one of said main ground lines is respectively connected to said second selection lines.

6. A semiconductor memory according to claim 5, wherein a plurality of said memory transistors each store multi-bit data.

7. A semiconductor memory according to claim 5, further comprising a sense amplifier coupled to a memory transistor via a main bit line, wherein said sense amplifier provides a drive signal to said memory transistor during a data reading operation.

8. A semiconductor memory apparatus according to claim 6, wherein said means for electrically separating comprises an insulation oxide film formed on said semiconductor substrate.

9. A semiconductor memory apparatus according to claim 8, further comprising a sense amplifier provided with at least two reference signals and with a data signal output from said plurality of memory cells, said sense amplifier providing an output signal based on a comparison between said at least two reference signals and said data signal.

10. The semiconductor memory apparatus according to claim 8, wherein said semiconductor substrate is provided with a peripheral circuit region, a device separation insulating oxide film is provided between the peripheral circuit region and a region where the memory cell arrays are formed, and the thickness of the device separation insulating oxide film is equal to or greater than the thickness of the insulation oxide film formed on said semiconductor substrate.

* * * * *